(12) United States Patent
Togawa et al.

(10) Patent No.: US 7,163,895 B2
(45) Date of Patent: Jan. 16, 2007

(54) POLISHING METHOD

(75) Inventors: Tetsuji Togawa, Tokyo (JP); Makoto Fukushima, Tokyo (JP); Kunihiko Sakurai, Tokyo (JP); Hiroshi Yoshida, Tokyo (JP); Osamu Nabeya, Tokyo (JP); Teruhiko Ichimura, Kanagawa (JP)

(73) Assignee: Ebara Corporation, Tokyo (JP)

( * ) Notice: Subject to any disclaimer, the term of this patent is extended or adjusted under 35 U.S.C. 154(b) by 218 days.

(21) Appl. No.: 10/481,019

(22) PCT Filed: Apr. 17, 2003

(86) PCT No.: PCT/JP03/04894

§ 371 (c)(1),
(2), (4) Date: May 20, 2004

(87) PCT Pub. No.: WO03/086706

PCT Pub. Date: Oct. 23, 2003

(65) Prior Publication Data

US 2004/0198011 A1    Oct. 7, 2004

(30) Foreign Application Priority Data

Apr. 18, 2002    (JP)    ............... 2002-116721

(51) Int. Cl.
*H01L 21/302*    (2006.01)
(52) U.S. Cl. ..................... 438/692; 438/977
(58) Field of Classification Search .......... 438/692, 438/977
See application file for complete search history.

(56) References Cited

U.S. PATENT DOCUMENTS

| | | | |
|---|---|---|---|
| 4,918,869 A * | 4/1990 | Kitta ..................... 451/288 |
| 6,790,763 B1 * | 9/2004 | Kondo et al. ............ 438/622 |
| 2002/0042246 A1 | 4/2002 | Togawa et al. |
| 2002/0098780 A1 | 7/2002 | Boo et al. |
| 2004/0072517 A1 | 4/2004 | Boo et al. |
| 2005/0118935 A1 | 6/2005 | Togawa et al. |
| 2005/0136806 A1 | 6/2005 | Boo et al. |

FOREIGN PATENT DOCUMENTS

| | | |
|---|---|---|
| EP | 1 197 292 A2 | 4/2002 |
| JP | 7-299734 | 11/1995 |
| JP | 2000-127026 | 5/2000 |
| JP | 2000-354960 | 12/2000 |
| JP | 2002-198337 | 7/2002 |

* cited by examiner

*Primary Examiner*—David Nelms
*Assistant Examiner*—Quoc Hoang
(74) *Attorney, Agent, or Firm*—Wenderoth, Lind & Ponack, L.L.P.

(57) ABSTRACT

The present invention is relates to a polishing method for polishing a semiconductor wafer (W) by pressing the semiconductor wafer (W) against a polishing surface (10) with use of a top ring (23) for holding the semiconductor wafer (W). A pressure chamber (70) is defined in the top ring (23) by attaching an elastic membrane (60) to a lower surface of a vertically movable member (62). The semiconductor wafer (W) is polished while a pressurized fluid is supplied to the pressure chamber (70) so that the semiconductor wafer (W) is pressed against the polishing surface (10) by a fluid pressure of the fluid. The semiconductor wafer (W) which has been polished is released from the top ring (23) by ejecting the pressurized fluid from an opening (62a) defined centrally in the vertically movable member (62).

5 Claims, 20 Drawing Sheets

FIG. 15
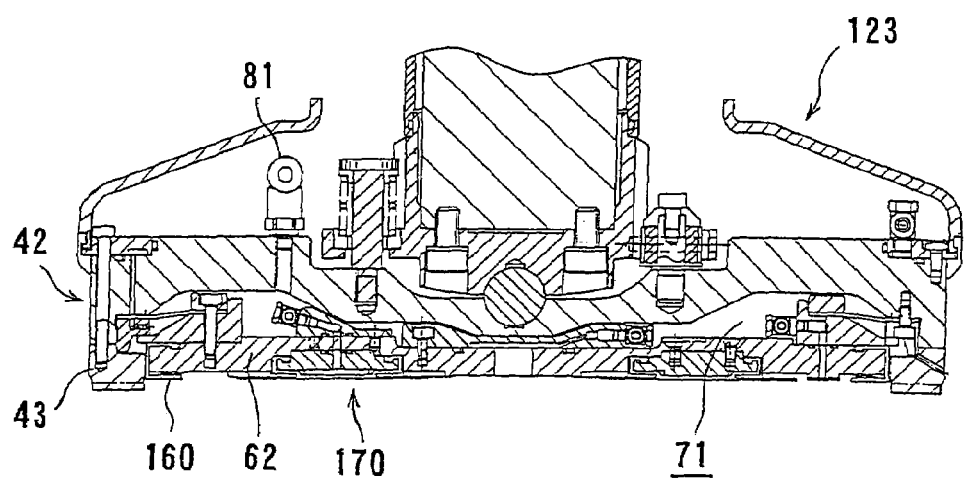
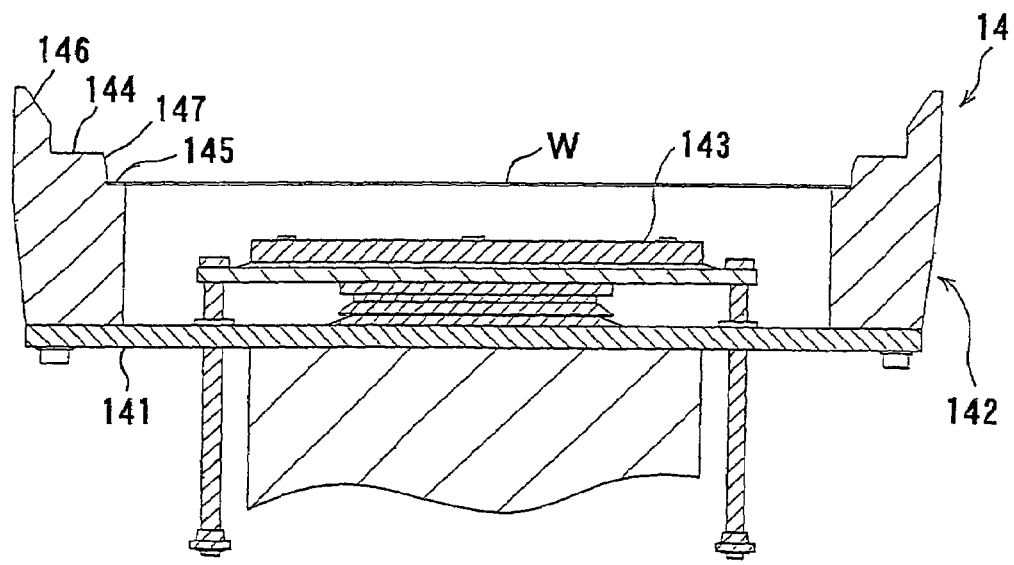

FIG. 20
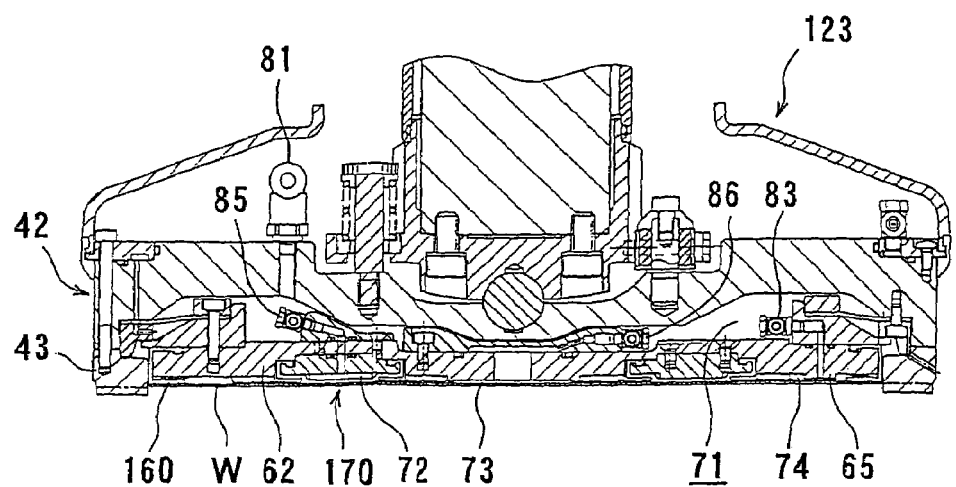
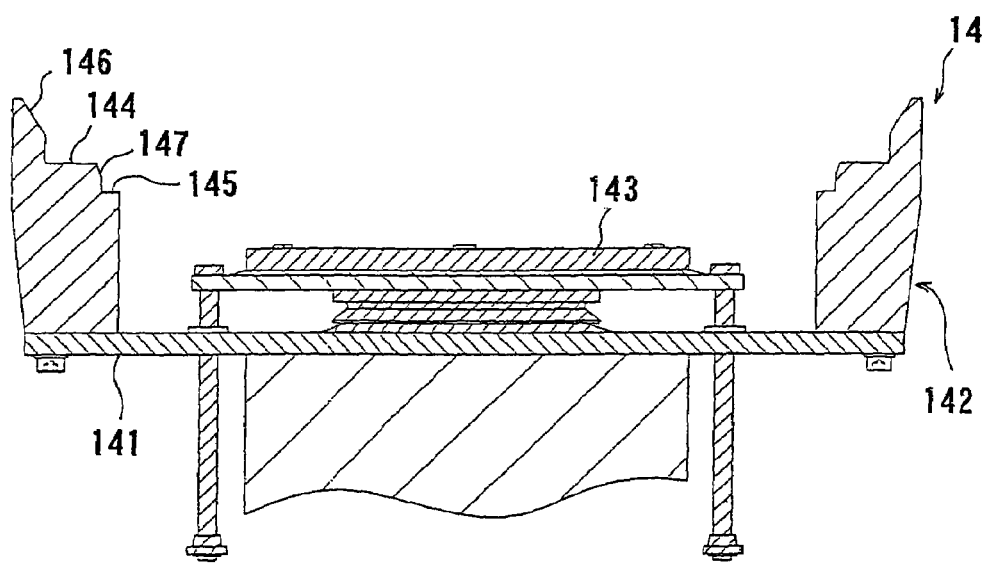

POLISHING METHOD

This application is a PCT/JP03/04894 Apr. 17, 2003.

TECHNICAL FIELD

The present invention relates to a polishing method, and more particularly to a polishing method for polishing a workpiece, such as a semiconductor wafer having a thin film formed on a surface thereof, to a flat mirror finish.

BACKGROUND ART

In recent years, semiconductor devices have become more integrated, and structures of semiconductor elements have become more complicated. Further, the number of layers in multilayer interconnections used for a logical system has been increased. Accordingly, irregularities on a surface of a semiconductor device become increased, so that step heights on the surface of the semiconductor device tend to be larger. This is because, in a manufacturing process of the semiconductor device, a thin film is formed on the semiconductor device, then micro machining processes, such as patterning or forming holes, are performed on the semiconductor device, and these processes are repeated many times to form subsequent thin films on the semiconductor device.

When the number of irregularities is increased on the surface of the semiconductor device, the following problems arise. The thickness of a film formed in a portion having a step is relatively small when a thin film is formed on the semiconductor device. An open circuit is caused by disconnection of interconnections, or a short circuit is caused by insufficient insulation between interconnection layers. As a result, good products cannot be obtained, and the yield tends to be reduced. Further, even if the semiconductor device initially works normally, the reliability of the semiconductor device is lowered after a long-term use. At the time of exposure in a lithography process, if the irradiation surface has irregularities, then a lens unit in an exposure system is locally unfocused. Therefore, if the irregularities of the surface of the semiconductor device are increased, then it becomes problematic that it is difficult to form a fine pattern itself on the semiconductor device.

Accordingly, in a manufacturing process of a semiconductor device, it increasingly becomes important to planarize a surface of the semiconductor device. The most important one of the planarizing technologies is CMP (Chemical Mechanical Polishing). In the chemical mechanical polishing, with use of a polishing apparatus, while a polishing liquid containing abrasive particles such as silica ($SiO_2$) therein is supplied onto a polishing surface such as a polishing pad, a substrate such as a semiconductor wafer is brought into sliding contact with the polishing surface, so that the substrate is polished.

This type of polishing apparatus comprises a polishing table having a polishing surface constituted by a polishing pad, a top ring or a carrier head for holding a semiconductor wafer, and the like. When the semiconductor wafer is polished with use of such a polishing apparatus, the semiconductor wafer is held and pressed against the polishing table under a predetermined pressure by the top ring. At this time, the polishing table and the top ring are moved relatively to each other to bring the semiconductor wafer into sliding contact with the polishing surface, so that the surface of the semiconductor wafer is polished to a flat mirror finish.

In such a polishing apparatus, if a relative pressing force between the semiconductor wafer being polished and the polishing surface of the polishing pad is not uniform over an entire surface of the semiconductor wafer, then the semiconductor wafer may insufficiently be polished or may excessively be polished at some portions depending on the pressing force applied to those portions of the semiconductor wafer. Therefore, it has been attempted to form a surface, for holding the semiconductor wafer, of the top ring with use of an elastic membrane made of an elastic material such as rubber and to apply a fluid pressure such as an air pressure to a backside surface of the elastic membrane to uniform the pressing force applied to the semiconductor wafer over the entire surface of the semiconductor wafer.

Further, the polishing pad is so elastic that the pressing force applied to a circumferential edge portion of the semiconductor wafer being polished becomes non-uniform, and hence only the circumferential edge portion of the semiconductor wafer may excessively be polished, which is called "edge rounding". In order to prevent such edge rounding, there has been used a top ring in which a semiconductor wafer is held at its circumferential edge portion by a guide ring or a retainer ring, and the annular portion of the polishing surface that corresponds to the circumferential edge portion of the semiconductor wafer is pressed by the guide ring or retainer ring.

When a semiconductor wafer is polished with use of such a top ring, it is necessary to attract and hold the semiconductor wafer which has been transferred to the top ring. Further, after the semiconductor wafer is polished, it is necessary to attract the semiconductor wafer again to the top ring and thereafter to release the semiconductor wafer from the top ring at a transfer position. However, the top ring using the above elastic membrane tends to fail in attracting and releasing the semiconductor wafer because of the presence of the elastic membrane.

DISCLOSURE OF INVENTION

The present invention has been made in view of the above drawbacks. It is an object of the present invention to provide a polishing method which can reliably attract and release a workpiece, to be polished, even if the workpiece is held and polished using an elastic membrane.

In order to solve the above drawbacks, according to a first aspect of the present invention, there is provided a polishing method for polishing a workpiece by pressing the workpiece against a polishing surface with use of a top ring for holding the workpiece, the polishing method comprising: defining a pressure chamber in the top ring by attaching an elastic membrane to a lower surface of a vertically movable member; polishing the workpiece while a pressurized fluid is supplied to the pressure chamber so that the workpiece is pressed against the polishing surface by a fluid pressure of the fluid; and releasing the workpiece which has been polished from the top ring by ejecting the pressurized fluid from an opening defined centrally in the vertically movable member.

When the pressurized fluid is ejected from the opening defined centrally in the vertically movable member, the pressurized fluid is delivered into the region where the elastic membrane and the workpiece are held in close contact with each other. Therefore, the workpiece can reliably be released.

In a preferred aspect of the present invention, a hole is provided in a surface, to be brought into close contact with the workpiece, of the elastic membrane which defines the pressure chamber; and the releasing comprises releasing the workpiece which has been polished from the top ring by ejecting the pressurized fluid not only from the opening defined centrally in the vertically movable member, but also from the hole provided in the elastic membrane.

Since the pressurized fluid is ejected not only from the opening defined centrally in the vertically movable member, but also from the hole in the elastic membrane, the workpiece can be released more reliably.

In a preferred aspect of the present invention, the pressurized fluid is ejected from the opening defined centrally in the vertically movable member after the pressurized fluid is ejected from the hole of the elastic membrane.

According to the present invention, it is possible to break the close contact between the elastic membrane and the workpiece, for thereby releasing the workpiece more reliably.

According to a second aspect of the present invention, there is provided a polishing method for polishing a workpiece by pressing the workpiece against a polishing surface with use of a top ring for holding the workpiece, the polishing method comprising: defining a pressure chamber in the top ring by attaching an elastic membrane to a lower surface of a vertically movable member; polishing the workpiece while a pressurized fluid is supplied to the pressure chamber so that the workpiece is pressed against the polishing surface by a fluid pressure of the fluid; when the polishing is finished, moving the vertically movable member downwardly so as to bring the workpiece into close contact with an attraction section provided on the vertically movable member; and attracting the workpiece to the top ring by the attraction section.

When the polishing process is finished, the workpiece and the vertically movable member may have occasionally been spaced from each other. In such a case, the attraction section fails to attract the workpiece even if the attraction section attempts to attract the workpiece. According to the present invention, when the polishing process is finished, the vertically movable member is moved downwardly to bring the workpiece into close contact with the attraction section, and thereafter the attraction section attracts and holds the workpiece. Consequently, it is possible to reliably attract the workpiece.

According to a third aspect of the present invention, there is provided a polishing method for polishing a workpiece by pressing the workpiece against a polishing surface with use of a top ring for holding the workpiece, the polishing method comprising: defining a pressure chamber in the top ring by attaching an elastic membrane to a lower surface of a vertically movable member; guiding the workpiece to the top ring while the vertically movable member is positioned upwardly with respect to a retainer ring which holds an outer circumferential edge of the workpiece; attracting the workpiece which has been guided to the top ring to the top ring by an attraction section provided on the vertically movable member; moving the workpiece which is held by the top ring onto the polishing surface; and polishing the workpiece while a pressurized fluid is supplied to the pressure chamber so that the workpiece is pressed against the polishing surface by a fluid pressure of the fluid.

If the vertically movable member projects downwardly from the retainer ring and the workpiece is attracted at a displaced position when the workpiece is transferred, then the workpiece tends to be caught by the retainer ring when the vertically movable member is moved upwardly in a subsequent motion, thus causing the workpiece to be dropped off and damaged. According to the present invention, since the vertically movable member is positioned upwardly with respect to the retainer ring in advance, the workpiece is transferred while the outer circumferential portion thereof is guided by the retainer ring. Therefore, the workpiece is not caught by the retainer ring when the vertically movable member is moved upwardly, and hence the workpiece can be prevented from being dropped off and damaged.

BRIEF DESCRIPTION OF DRAWINGS

FIG. 15 is a vertical cross-sectional view showing the relationship between the top ring shown in FIG. 13 and a pusher;

FIG. 20 is a vertical cross-sectional view showing the relationship between the top ring shown in FIG. 13 and the pusher;

BEST MODE FOR CARRYING OUT THE INVENTION

Figure 1:
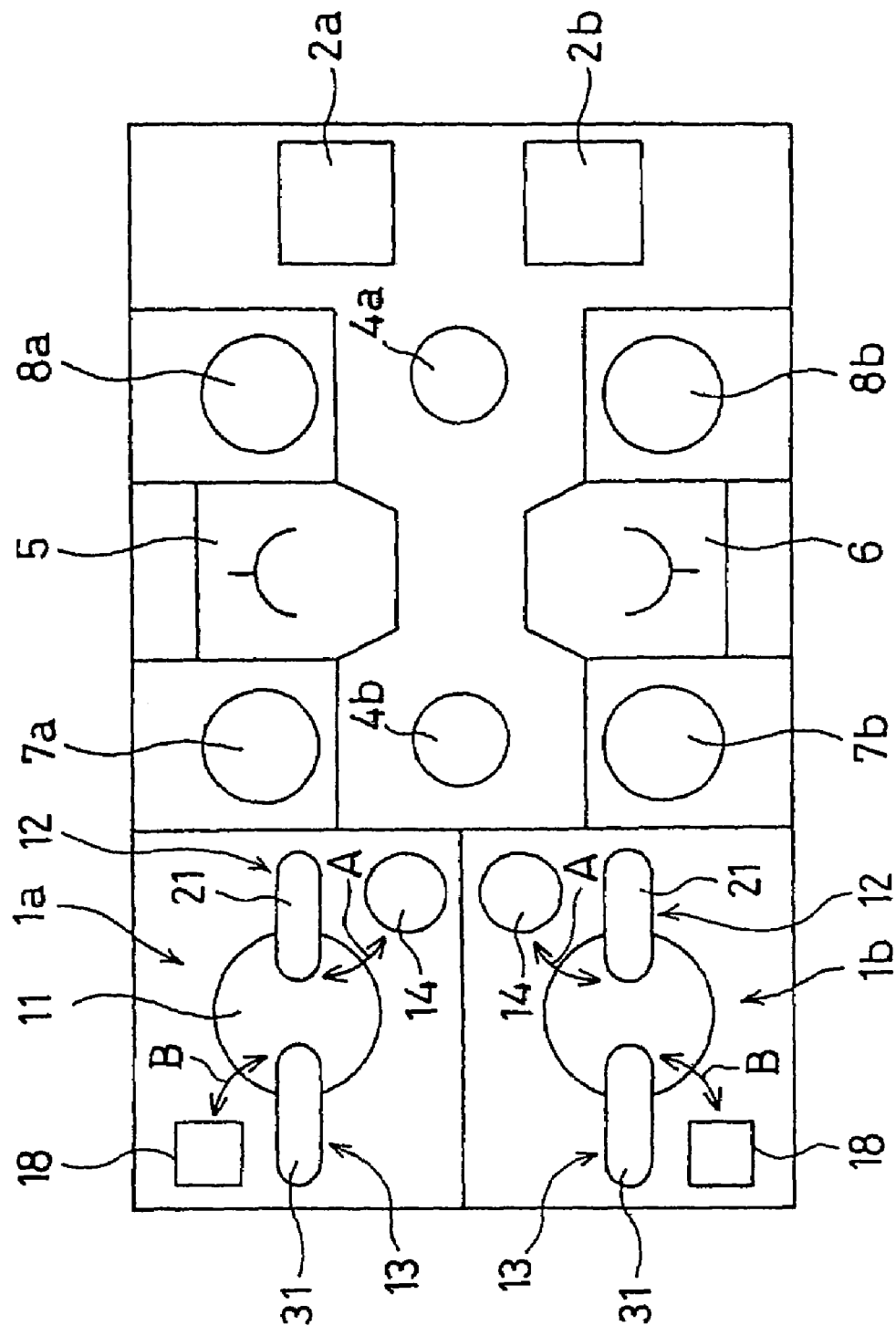
FIG. 1 is a schematic plan view showing a polishing apparatus according to a first embodiment of the present invention.

A polishing method according to a first embodiment of the present invention will be described below in detail with reference to FIGS. 1 through 12. FIG. 1 is a schematic plan view showing a polishing apparatus according to the first embodiment of the present invention. As shown in FIG. 1, in the polishing apparatus, a pair of polishing sections 1a, 1b are disposed at one side of a space on a floor having a rectangular shape so as to face each other. A pair of load/unload units for placing cassettes 2a, 2b thereon which accommodate semiconductor wafers are disposed at the other side. Two transfer robots 4a, 4b for transferring the semiconductor wafer are disposed on a line connecting the polishing sections 1a, 1b to the load/unload units, thus forming a transfer line. Reversing devices 5, 6 are disposed on each side of the transfer line, respectively, and cleaning devices 7a, 8a and cleaning devices 7b, 8b are disposed so as to interpose the respective reversing devices 5, 6 therebetween.

The two polishing sections 1a, 1b have basically the same specifications and are disposed symmetrically with respect to the transfer line. Each of the polishing sections 1a, 1b comprises a polishing table 11 having a polishing pad 10 attached to an upper surface thereof, a top ring unit 12 for holding a semiconductor wafer as a workpiece to be polished by vacuum suction and pressing the semiconductor wafer against the polishing pad on the polishing table 11 to polish the semiconductor wafer, a dressing unit 13 for dressing the polishing pad on the polishing table 11. Each polishing sections 1a, 1b also has a pusher 14 positioned at a transfer-line side for transferring the semiconductor wafer to and from the top ring unit 12.

Each transfer robots 4a, 4b has an articulated arm which is bendable and stretchable in a horizontal plane and has upper and lower holding portions which are separately used as a dry finger and a wet finger. Since two robots are used in the present embodiment, the first transfer robot 4a is basically responsible for a region from the reversing devices 5, 6 to the cassettes 2a, 2b, and the second transfer robot 4b is basically responsible for a region from the reversing devices 5, 6 to the polishing sections 1a, 1b.

The reversing devices 5, 6 serve to turn over the semiconductor wafer, and are disposed in such a position that hands of the transfer robots 4a, 4b can reach the reversing devices 5, 6. In the present embodiment, the two reversing devices 5, 6 are used separately for handling a dry substrate and for handling a wet substrate.

Each of the cleaning devices 7a, 7b, 8a and 8b may be of any type. For example, the cleaning devices 7a, 7b at the side of the polishing sections 1a, 1b are of a type that wipes both surfaces of a semiconductor wafer with rollers having sponges, and the cleaning devices 8a, 8b at the side of the cassettes 2a, 2b are of a type that holds an edge of a semiconductor wafer and rotates the semiconductor wafer in a horizontal plane while supplying a cleaning liquid to the semiconductor wafer. The latter also has a function as a drier for centrifugally dehydrating and drying a semiconductor wafer. The cleaning devices 7a, 7b can perform a primary cleaning process of the semiconductor wafer, and the cleaning devices 8a, 8b can perform a secondary cleaning process of the semiconductor wafer after the primary cleaning process.

Figure 2:
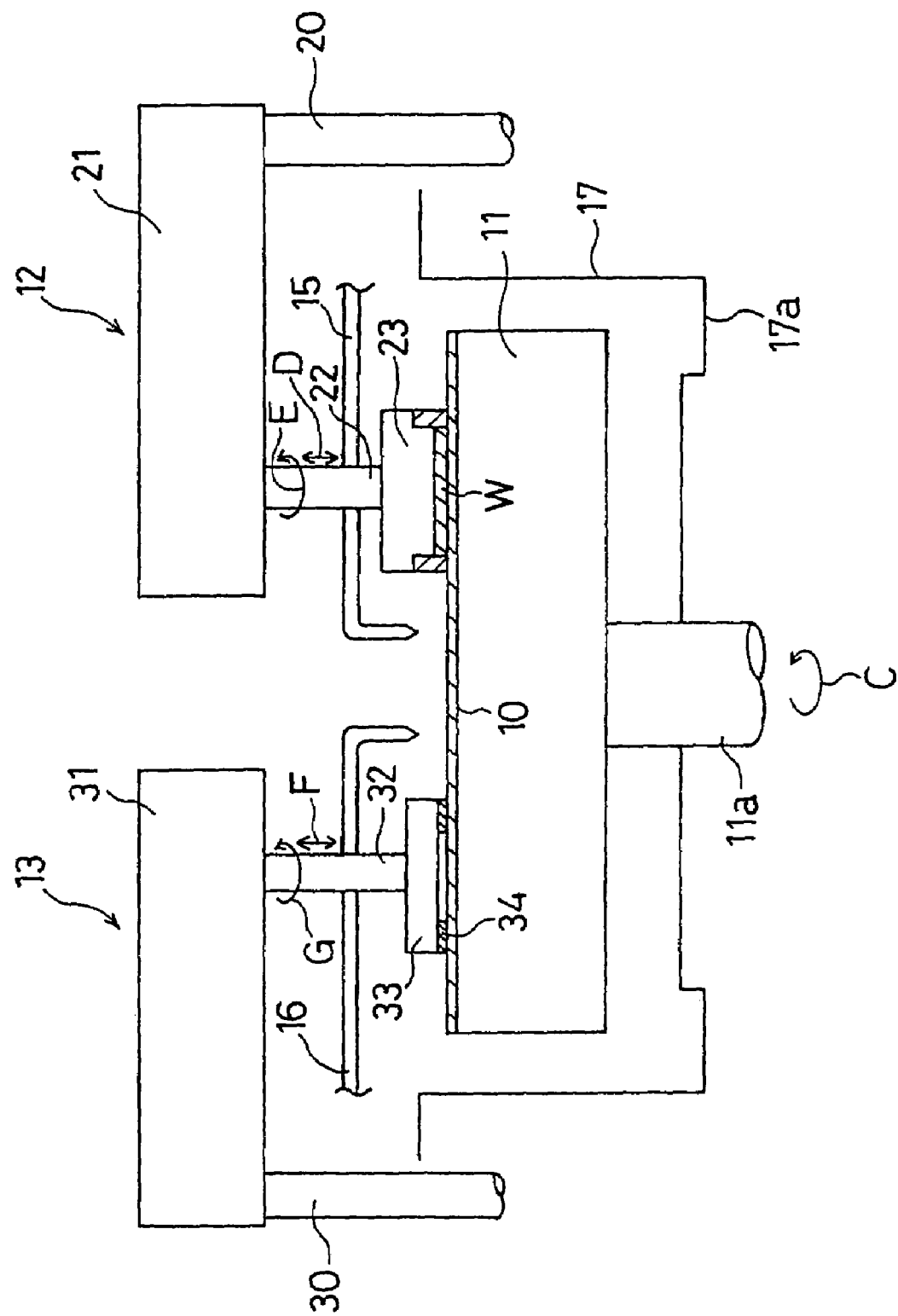
FIG. 2 is a vertical cross-sectional view showing an essential part of a polishing section of the polishing apparatus shown in FIG. 1.

Next, the above polishing section will be described in detail. FIG. 2 is a vertical cross-sectional view showing an essential part of the polishing section 1a shown in FIG. 1. Although only the polishing section 1a will be described below, the following description can be applied to the polishing section 1b.

As shown in FIG. 2, the polishing section 1a comprises a polishing table 11 having a polishing pad 10 attached to an upper surface thereof, a top ring unit 12 for holding a semiconductor wafer W as a workpiece to be polished by vacuum suction and pressing the semiconductor wafer W against the polishing table 11 to polish the semiconductor wafer W, and a dressing unit 13 for dressing the polishing pad 10 on the polishing table 11. The polishing table 11 is coupled to a motor (not shown) disposed below the polishing table 11 through a table shaft 11a, and hence the polishing table 11 is rotatable about the table shaft 11a in a direction indicated by the arrow C in FIG. 2. A surface of the polishing pad 10 on the polishing table 11 serves as a polishing surface which is brought into sliding contact with a semiconductor wafer W as a workpiece to be polished.

Various kinds of polishing pads are commercially available. For example, some of these are SUBA800, IC-1000, and IC-1000/SUBA400 (two-layer cloth) manufactured by Rodel Inc., and Surfin xxx-5 and Surfin 000 manufactured by Fujimi Inc. SUBA800, Surfin xxx-5, and Surfin 000 are non-woven fabrics composed of fibers bound together by urethane resin, and IC-1000 is made of hard polyurethane foam (single layer). Polyurethane foam is porous and has a large number of fine recesses or holes formed in a surface thereof.

A polishing liquid supply nozzle 15 and a water supply nozzle 16 are disposed above the polishing table 11. The polishing liquid supply nozzle 15 supplies pure water or a chemical liquid onto the polishing surface 10 on the polishing table 11. The water supply nozzle 16 supplies a dressing liquid (e.g., water) for use in dressing onto the polishing surface 10 on the polishing table 11. The polishing table 11 is surrounded by a frame 17 for recovering the polishing liquid and water, and a tub 17a is formed in a lower portion of the frame.

The top ring unit 12 comprises a rotatable support shaft 20, a top ring head 21 coupled to an upper end of the support shaft 20, a top ring shaft 22 extending downwardly from a free end of the top ring head 21, and a substantially disk-like top ring 23 connected to a lower end of the top ring shaft 22. When the top ring head 21 is angularly moved by the rotation of the support shaft 20, the top ring 23 is moved horizontally. Thus, the top ring 23 can be reciprocated between the pusher 14 and a polishing position on the polishing surface 10, as indicated by the arrow A in FIG. 1. Further, the top ring 23 is coupled through the top ring shaft 22 to a motor (not shown) and a lifting/lowering cylinder (not shown) provided in the top ring head 21, so that the top ring 23 is vertically movable and is rotatable about the top ring shaft 22, as indicated by the arrows D, E in FIG. 2. The semiconductor wafer W to be polished is attracted to and held on the lower surface of the top ring 23 by vacuum suction. With the above mechanisms, the top ring 23 can press the semiconductor wafer W held on the lower surface thereof against the polishing surface 10 under a desired pressure while being rotated.

The dressing unit 13 serves to regenerate the polishing surface 10 that has been deteriorated by a polishing process. The dressing unit 13 is disposed at an opposite side of top ring unit 12 with respect to a center of polishing table 11. The dressing unit 13, as with the above top ring unit 12, comprises a rotatable support shaft 30, a dresser head 31 coupled to an upper end of the support shaft 30, a dresser shaft 32 extending downwardly from a free end of the dresser head 31, a dresser 33 coupled to a lower end of the dresser shaft 32, and a dressing member 34 attached to a lower surface of the dresser 33. When the dresser head 31 is angularly moved by the rotation of the support shaft 30, the dresser 33 is moved horizontally, and thus can be reciprocated between a dressing position on the polishing surface 10 and a standby position located outwardly of the polishing table 11, as indicated by the arrow B in FIG. 1.

Figure 3:
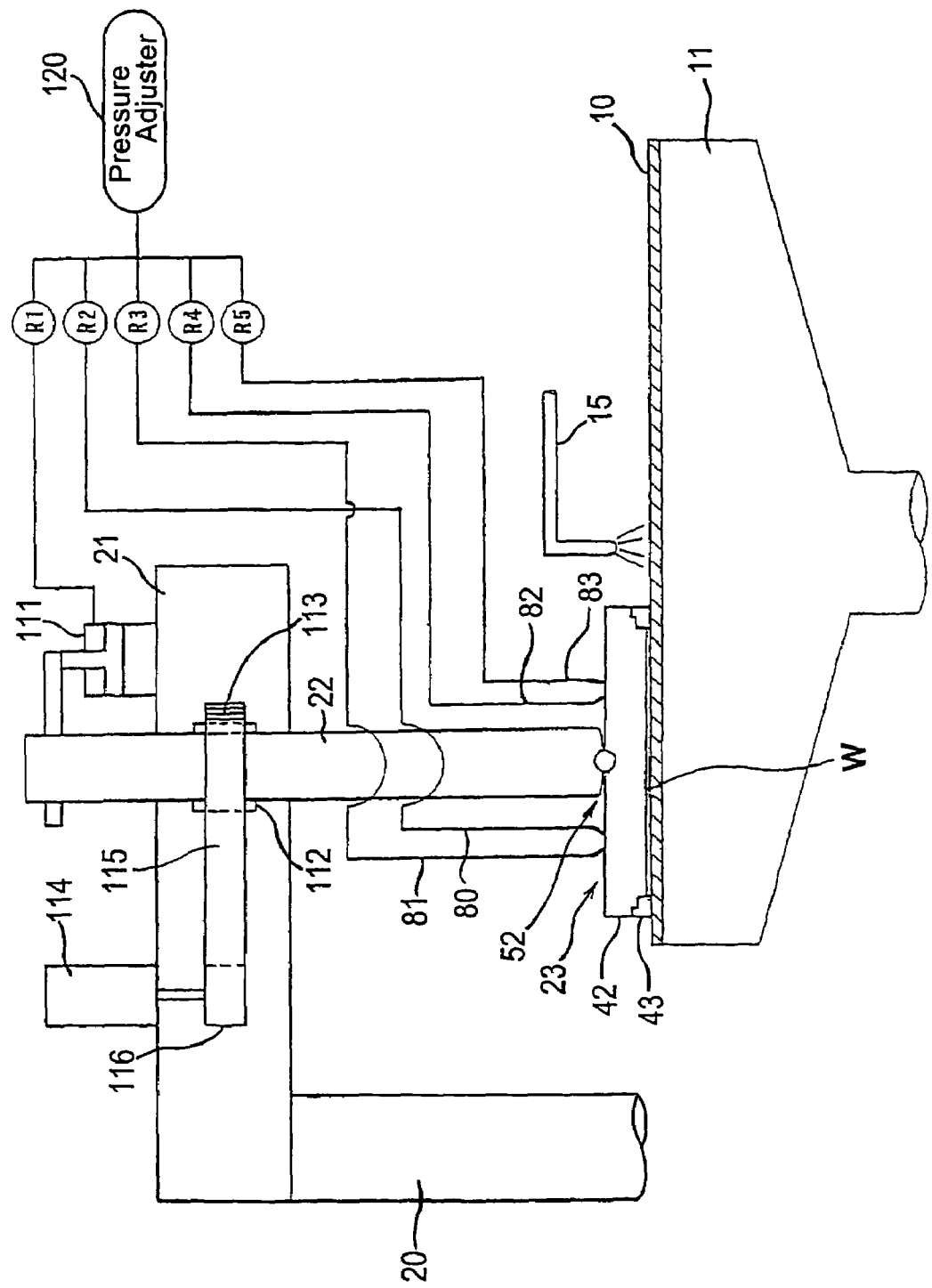
FIG. 3 is a view showing a top ring unit of the polishing section shown in FIG. 2 together with a fluid passage arrangement.
Figure 4:
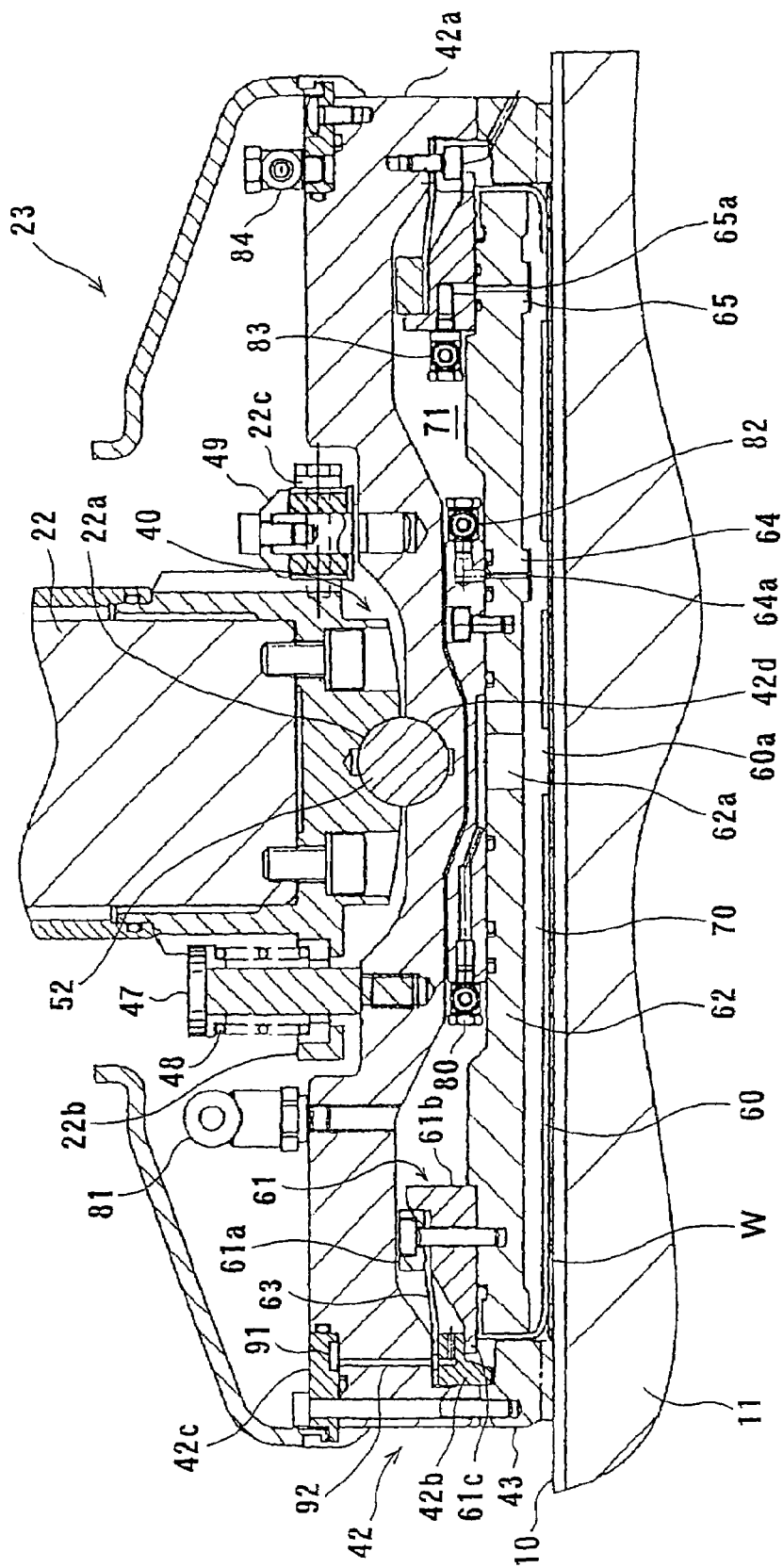
FIG. 4 is a vertical cross-sectional view showing a top ring of the top ring unit shown in FIG. 3.

FIG. 3 is a schematic view showing the top ring unit 12 of the polishing section shown in FIG. 2 together with a fluid passage arrangement, and FIG. 4 is a vertical cross-sectional view showing the top ring 23 of the top ring unit 12 shown in FIG. 3. As shown in FIGS. 3 and 4, the top ring 23 is connected to the top ring shaft 22 through a universal joint 40. The top ring shaft 22 is coupled to a top ring air cylinder 111 fixed to the top ring head 21. The top ring 23 comprises a substantially disk-like top ring body 42 coupled to the lower end of the top ring shaft 22, and the retainer ring 43 disposed on an outer circumferential portion of the top ring body 42. The top ring body 42 is made of a material having high strength and rigidity, such as metal or ceramics. The retainer ring 43 is made of highly rigid synthetic resin, ceramics, or the like.

The top ring air cylinder 111 is connected to a pressure adjuster 120 through a regulator R1. The pressure adjuster 120 serves to adjust a pressure by supplying a pressurized fluid such as pressurized air from a compressed air source or developing a vacuum with a pump or the like. The pressure adjuster 120 can adjust an air pressure of the pressurized air or the like supplied to the top ring air cylinder 111 with the regulator R1. The top ring air cylinder 111 allows the top ring shaft 22 to move vertically, so that the whole top ring 23 is lifted or lowered and the retainer ring 43 mounted on the top ring body 42 is pressed against the polishing table 11 under a predetermined pressing force.

The top ring shaft 22 is coupled to a rotary sleeve 112 by a key (not shown). The rotary sleeve 112 has a timing pulley 113 disposed on an outer circumferential portion thereof. A top ring motor 114 is fixed to the top ring head 21, and the above timing pulley 113 is connected to a timing pulley 116 mounted on the top ring motor 114 through a timing belt 115. Therefore, when the top ring motor 114 is energized, the rotary sleeve 112 and the top ring shaft 22 are rotated together with each other through the timing pulley 116, the timing belt 115, and the timing pulley 113, thus rotating the top ring 23. The top ring head 21 is supported by the support shaft 20 which is rotatably supported by a frame (not shown).

As shown in FIG. 4, the top ring body 42 comprises a housing 42a having a cylinder-vessel shape, an annular pressurizing-sheet support 42b fitted in a cylindrical portion of the housing 42a, and an annular seal 42c fitted into an outer circumferential edge of an upper surface of the housing 42a. The retainer ring 43 is fixed to a lower end of the housing 42a of the top ring body 42 and has a lower portion projecting radially inwardly.

The top ring shaft 22 is disposed upwardly of the central portion of the housing 42a of the top ring body 42. The top ring body 42 and the top ring shaft 22 are coupled to each other through the universal joint 40. The universal joint 40 has a spherical bearing mechanism for allowing the top ring body 42 and the top ring shaft 22 to be tilted with respect to each other, and a rotation transmitting mechanism for transmitting the rotation of the top ring shaft 22 to the top ring body 42. The spherical bearing mechanism and the rotation transmitting mechanism transmit a pressing force and a rotating force from the top ring shaft 22 to the top ring body 42 while allowing the top ring body 42 and the top ring shaft 22 to be tilted with respect to each other.

The spherical bearing mechanism comprises a hemispherical concave recess 22a defined centrally in the lower surface of the top ring shaft 22, a hemispherical concave recess 42d defined centrally in the upper surface of the top ring body 42, and a bearing ball 52 made of a highly hard material such as ceramics and interposed between the hemispherical concave recesses 22a and 42d. As shown in FIG. 4, a connecting bolt 47 is attached to the top ring body 42 in the vicinity of the top ring shaft 22, and a coil spring 48 is interposed between the connecting bolt 47 and a spring retainer 22b provided on the top ring shaft 22. With this structure, the top ring body 42 is held tiltably with respect to the top ring shaft 22.

On the other hand, the rotation transmitting mechanism comprises engage pins 49 fixed to the top ring body 42 in the vicinity of the top ring shaft 22, and engage holes 22c formed in the top ring shaft 22. Since each of the engage pins 49 is movable in each of the engage holes 22c, even when the top ring body 42 is tilted, the engage pins 49 are held in engagement with the engage holes 22c while a contact point is displaced, so that the rotating torque of the top ring shaft 22 is reliably transmitted to the top ring body 42 through the rotation transmitting mechanism.

The top ring body 42 and the retainer ring 43 have a space defined therein, which accommodates therein an elastic pad 60 which is brought into close contact with the semiconductor wafer W held by the top ring 23, an annular holder ring 61, and a substantially disk-shaped chucking plate (vertically movable member) 62 which is vertically movable in the space formed in the top ring body 42. The elastic pad 60 has an outer circumferential portion which is clamped between the holder ring 61 and the chucking plate 62 fixed to the lower end of the holder ring 61, and covers the lower surface of the chucking plate 62. Thus, a pressure chamber 70 is formed between the elastic pad 60 and the chucking plate 62. The elastic pad 60 is made of a rubber having excellent strength and durability such as ethylene propylene rubber (EPDM), polyurethane rubber, silicone rubber, or neoprene rubber.

The chucking plate 62 has an opening 62a defined centrally therein. The opening 62a communicates with a fluid passage 80 comprising a tube, a connector, and the like, and is connected to the pressure adjuster 120 through a regulator R2 provided on the fluid passage 80. Specifically, the pressure chamber 70 formed between the elastic pad 60 and the chucking plate 62 is connected to the pressure adjuster 120 through the regulator R2 provided on the fluid passage 80. The elastic pad 60 has a central hole 60a having a large diameter (e.g., a diameter of 12 mm) at a position corresponding to the opening 62a.

A pressurizing sheet 63 comprising an elastic membrane is provided between the holder ring 61 and the top ring body 42. One edge portion of the pressurizing sheet 63 is clamped by the pressurizing-sheet support 42b attached to the lower surface of the top ring body 42, and other edge portion of the pressurizing sheet 63 is clamped between an upper portion 61a of the holder ring 61 and a stopper 61b. The top ring body 42, the chucking plate 62, the holder ring 61, and the pressurizing sheet 63 define a pressure chamber 71 in the top ring body 42. As shown in FIG. 4, a fluid passage 81 comprising a tube, a connector, and the like communicates with the pressure chamber 71, and the pressure chamber 71 is connected to the pressure adjuster 120 through a regulator R3 provided on the fluid passage 81. The pressurizing sheet 63 is made of a rubber having excellent strength and durability such as ethylene propylene rubber (EPDM), polyurethane rubber, silicone rubber, or neoprene rubber, or made of a reinforced rubber containing fibers, very thin stainless (e.g., having a thickness of 0.2 mm), or the like.

Since a small gap is formed between the outer circumferential surface of the elastic membrane 60 and the retainer ring 43, components such as the holder ring 61 and the chucking plate 62 can vertically be moved with respect to the top ring body 42 and the retainer ring 43 in a floating manner. The stopper 61b of the holder ring 61 has a plurality of projections 61c projecting radially outwardly from the outer circumferential edge thereof. When the projections 61c engage an upper surface of a radially inwardly projecting portion of the retainer ring 43, a downward movement of the components such as the above holder ring 61 is restricted to a predetermined position.

In the case where the pressurizing sheet 63 is made of an elastic member such as a rubber, if the pressurizing sheet 63 is clamped between the retainer ring 43 and the top ring body 42, then the pressurizing sheet 63 as an elastic member is elastically deformed. Consequently, a desired horizontal plane cannot be maintained on the lower surface of the retainer ring 43. Therefore, in order to prevent such a problem from occurring, the pressurizing-sheet support 42b is provided as a separate member in the present embodiment, so that the pressurizing sheet 63 is clamped between the housing 42a of the top ring body 42 and the pressurizing-sheet support 42b. The retainer ring 43 may vertically be movable with respect to the top ring body 42, or the retainer ring 43 may have a structure capable of being pressed independently of the top ring body 42. In such cases, the pressurizing sheet 63 is not necessarily fixed in the above manner.

The pressure chamber 70 between the chucking plate 62 and the elastic pad 60, and the pressure chamber 71 positioned above the chucking plate 62 are supplied with a pressurized fluid such as pressurized air, or the atmospheric pressure or vacuum is produced in the pressure chambers 70, 71 through the fluid passages 80, 81 communicating respectively with the pressure chambers 70, 71. Specifically, as shown in FIG. 3, the pressures of the pressurized fluids supplied to the respective pressure chambers 70, 71 can be adjusted by the regulators R2, R3 provided on the fluid passages 80, 81 communicating respectively with the pressure chambers 70, 71. Thus, it is possible to independently control the pressures in the pressure chambers 70, 71, or independently produce the atmospheric pressure or vacuum in the pressure chambers 70, 71.

The chucking plate 62 has an inner attraction section 64 and an outer attraction section 65 which project downwardly and are disposed outwardly of the opening 62a. The inner attraction section 64 has a communication hole 64a defined therein which communicates with a fluid passage 82 comprising a tube, a connector, and the like. The inner attraction section 64 is connected to the pressure adjuster 120 through a regulator R4 provided on the fluid passage 82. As with the inner attraction section 64, the outer attraction section 65 has a communication hole 65a defined therein which communicates with a fluid passage 83 comprising a tube, a connector, and the like. The outer attraction section 65 is connected to the pressure adjuster 120 through a regulator R5 provided on the fluid passage 83. The pressure adjuster 120 develops a negative pressure in open ends of the communication holes 64a, 65a of the attraction sections 64, 65, for thereby attracting the semiconductor wafer W to the attraction sections 64, 65. Elastic sheets such as rubber sheets or backing films are attached to the lower surfaces of the attraction sections 64, 65, respectively, so that the attraction sections 64, 65 attract and hold the semiconductor wafer W softly.

The seal 42c of the top ring body 42 has a cleaning liquid passage 91 as an annular groove defined in a lower surface thereof. The cleaning liquid passage 91 communicates with a fluid passage 84. A plurality of communication holes 92 extend from the cleaning liquid passage 91 of the seal 42c and pass through the housing 42a and the pressurizing-sheet support 42b. The communication holes 92 communicate with a small gap between the outer circumferential surface of the elastic pad 60 and the retainer ring 43. A cleaning liquid (e.g., pure water) is supplied through the cleaning liquid passage 91 to the gap.

Operation of the polishing apparatus having such a structure will be described below. First, the first transfer robot 4a takes a semiconductor wafer W from the cassette 2a or 2b, and the reversing device 5 or 6 reverses the semiconductor wafer W. Thereafter, the second transfer robot 4b transfers and places the semiconductor wafer W onto the pusher 14. In this state, the top ring head 21 of the top ring unit 12 is angularly moved to bring the top ring 23 to a position above the pusher 14.

Figure 5:
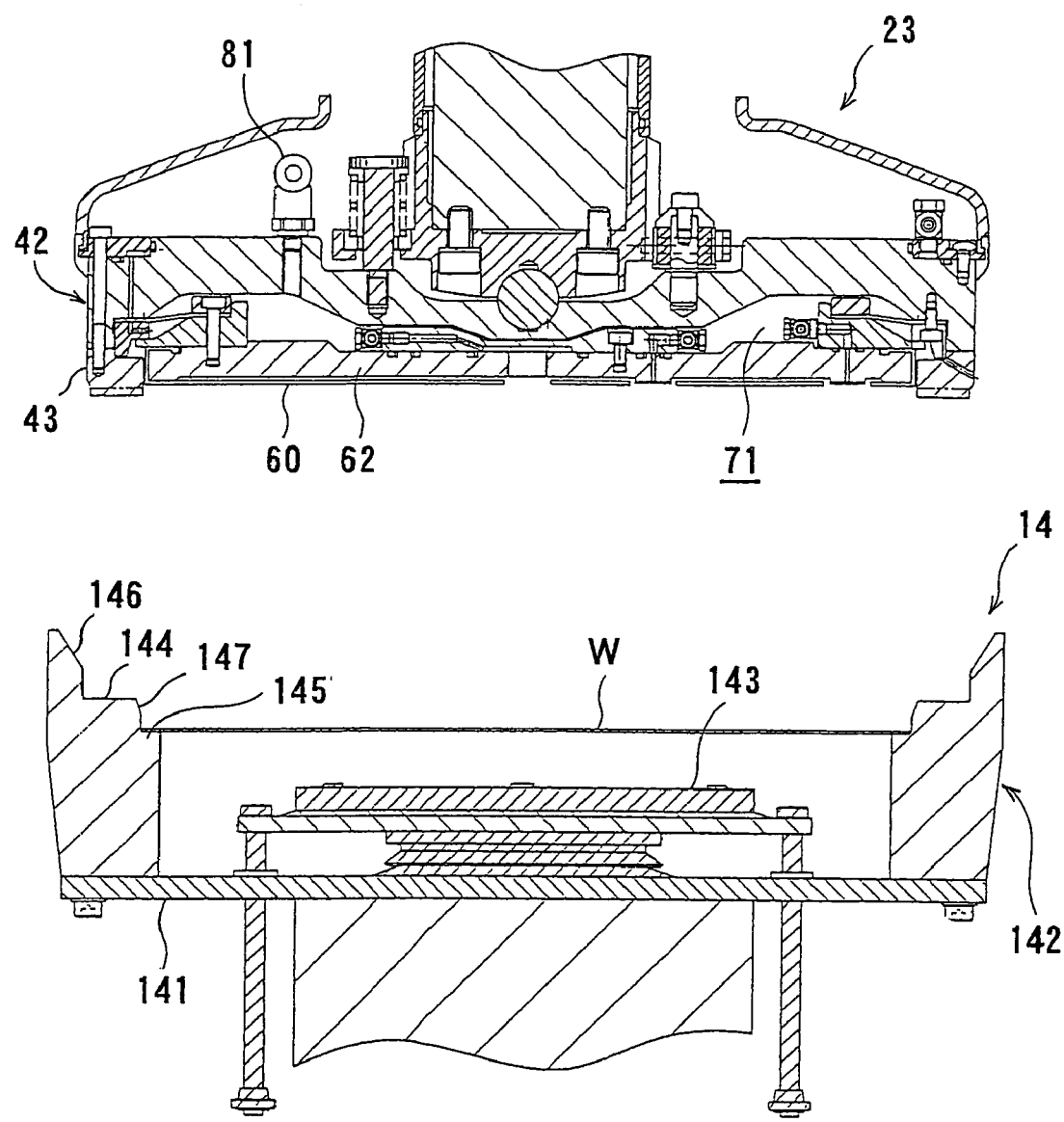
FIG. 5 is a vertical cross-sectional view showing the relationship between the top ring shown in FIG. 4 and a pusher.

FIG. 5 is a vertical cross-sectional view showing the state of the polishing apparatus at this time. As shown in FIG. 5, the pusher 14 comprises a guide stage 141 which is vertically movable by an air cylinder or the like, a wafer guide 142 disposed on an outer circumferential portion of the guide stage 141, and a push stage 143 which is disposed above the guide stage 141 and is vertically movable independently of the guide stage 141. The wafer guide 142 has a two-step structure having an upper step 144 and a lower step 145. The upper step 144 of the wafer guide 142 serves to access the lower surface of the retainer ring 43 of the top ring 23, and the lower step 145 serves to centrally align and hold the semiconductor wafer W. A taper 146 for guiding the retainer ring 43 is formed upwardly of the upper step 144, and a taper 147 for guiding the semiconductor wafer W is formed upwardly of the lower step 145. The semiconductor wafer W is placed on the lower step 145 of the wafer guide 142 in such a state that the semiconductor wafer W is centrally aligned by the taper 147 of the wafer guide 142.

In the state shown in FIG. 5, the pressure chamber 71 in the top ring 23 is connected to the pressure adjuster 120 through the fluid passage 81, so that a negative pressure is developed in the pressure chamber 71. Therefore, as shown in FIG. 5, the chucking plate 62 is positioned upwardly with respect to the retainer ring 43, and hence the semiconductor wafer W can be attracted reliably as described later.

Figure 6:
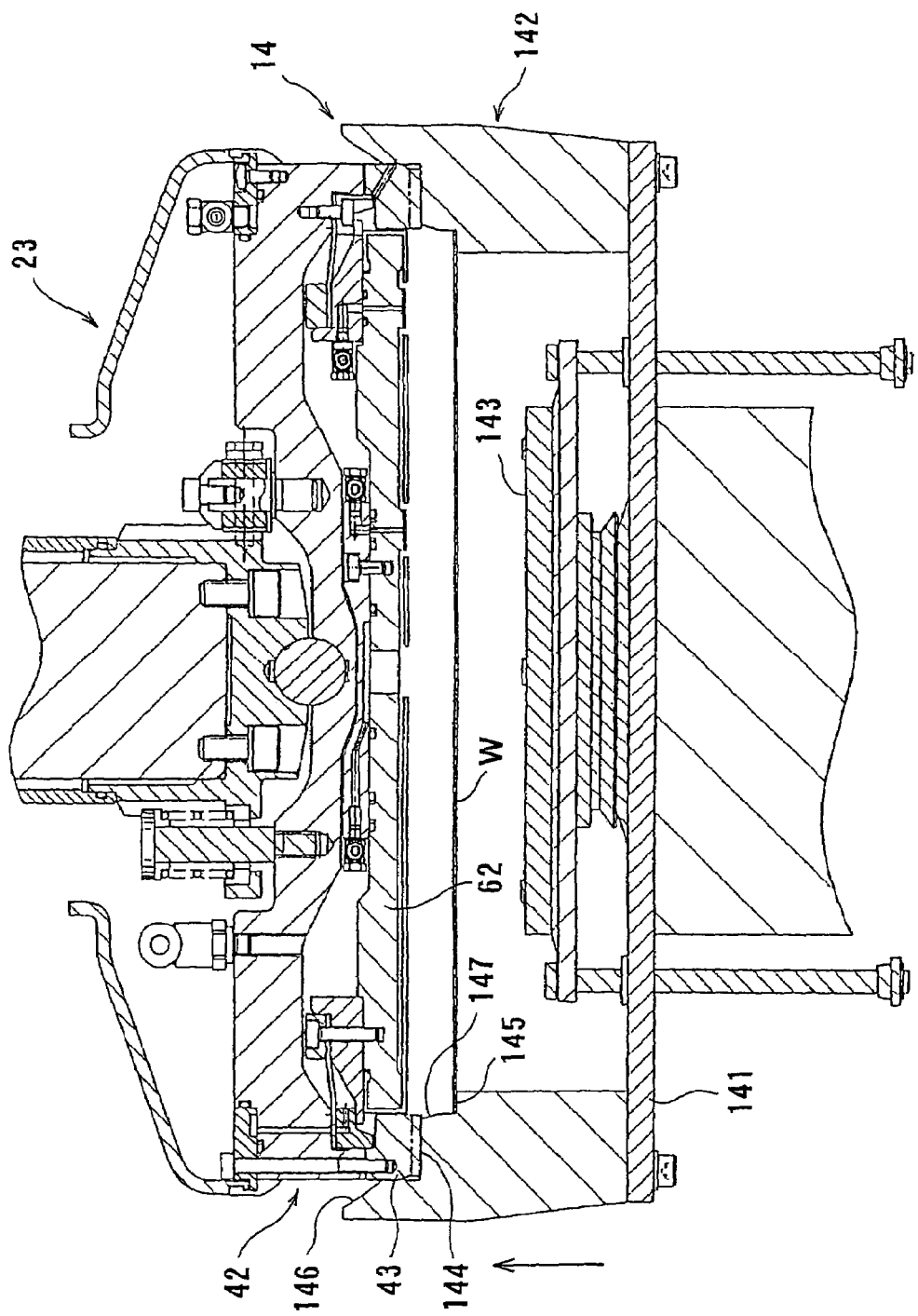
FIG. 6 is a vertical cross-sectional view showing the relationship between the top ring shown in FIG. 4 and the pusher.

Next, as shown in FIG. 6, the guide stage 141 of the pusher 14 is moved upwardly to guide the retainer ring 43 onto the upper step 144 of the wafer guide 142 by the taper 146 of the wafer guide 142. When the upper step 144 of the wafer guide 142 is brought into contact with the lower surface of the retainer ring 43, the upward movement of the guide stage 141 is finished.

Figure 7:
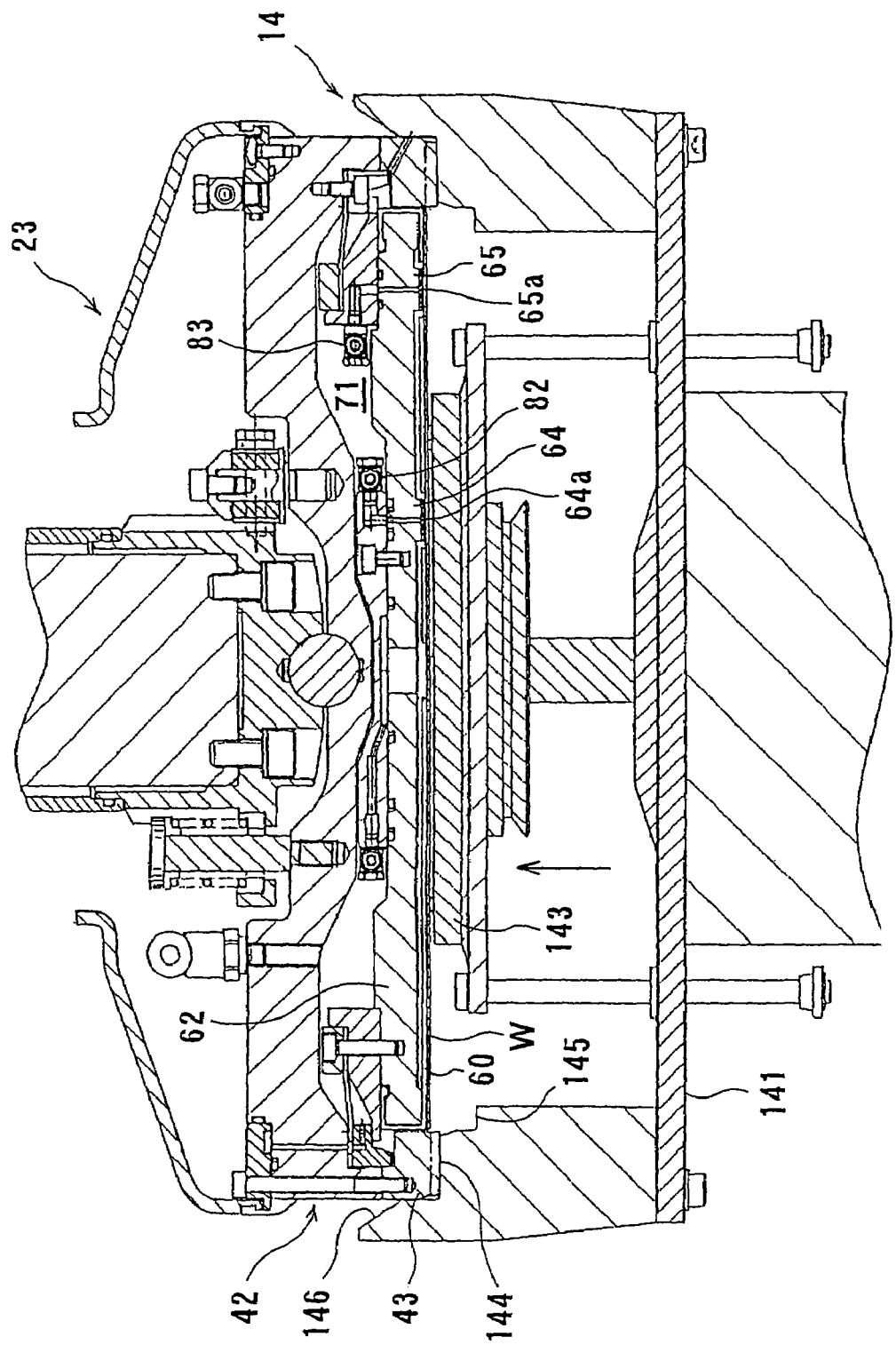
FIG. 7 is a vertical cross-sectional view showing the relationship between the top ring shown in FIG. 4 and the pusher.

In this state, as shown in FIG. 7, the push stage 143 of the pusher 14 is moved upwardly to hold a pattern surface of the semiconductor wafer W which has been placed on the lower step 145 of the wafer guide 142, and bring the semiconductor wafer W into close contact with the elastic pad 60 of the top ring 23. The communication holes 64a, 65a of the attraction sections 64, 65 are connected to the pressure adjuster 120 through the fluid passages 82, 83, and the semiconductor wafer W is attracted to the lower surfaces of the attraction sections 64, 65 by a sucking action of the communication holes 64a, 65a.

If the chucking plate 62 projects downwardly from the retainer ring 43 and the semiconductor wafer W is attracted at a displaced position when the semiconductor wafer W is transferred, then the semiconductor wafer W tends to be caught by the retainer ring 43 when the chucking plate 62 is moved upwardly in a subsequent motion, thus causing the semiconductor wafer W to be dropped off and damaged. In the present embodiment, since the negative pressure is developed in the pressure chamber 71 in the top ring 23 so as to position the chucking plate 62 upwardly with respect to the retainer ring 43 in advance, the semiconductor wafer W is transferred while the outer circumferential portion thereof is guided by the retainer ring 43. Therefore, the semiconductor wafer W is not caught by the retainer ring 43 when the chucking plate 62 is moved upwardly, and hence the semiconductor wafer W can be prevented from being dropped off and damaged.

When the attraction of the semiconductor wafer W is completed, the pusher 14 is moved downwardly, and the top ring head 21 is moved angularly horizontally to a position above the polishing surface 10 while attracting the semiconductor wafer W. The outer circumferential edge of the semiconductor wafer W is held by the retainer ring 43 so that the semiconductor wafer W is not dislodged from the top ring 23. The top ring 23 is moved downwardly while being rotated to press the semiconductor wafer W against the polishing surface 10 of the rotating polishing table 11. Specifically, during the polishing process, the semiconductor wafer W is released from the attraction sections 64, 65, and is held on the lower surface of the top ring 23. The top ring air cylinder 111 coupled to the top ring shaft 22 is operated to press the retainer ring 43 fixed to the lower end of the top ring 23 against the polishing surface 10 of the polishing table 11 under a predetermined pressing force. In this state, a pressurized fluid having a predetermined pressure is supplied to the pressure chamber 70, thereby pressing the semiconductor wafer W against the polishing surface of the polishing table 11. At this time, a polishing liquid is supplied from the polishing liquid supply nozzle 15, and the semiconductor wafer W is polished in the presence of the polishing liquid between the surface to be polished (i.e., lower surface) of the semiconductor wafer W and the polishing surface 10. FIG. 4 shows the state in which the semiconductor wafer W is polished.

As described above, the pressing force applied by the top ring air cylinder 111 to press the retainer ring 43 against the polishing surface 10 and the pressing force applied by the pressurized air supplied to the pressure chamber 70 to press the semiconductor wafer W against the polishing surface 10 are appropriately adjusted to polish the semiconductor wafer W. When the pressurized fluid is supplied to the pressure chamber 70, the chucking plate 62 is subjected to an upward force. In the present embodiment, the pressurized fluid is supplied to the pressure chamber 71 through the fluid passage 81, thus preventing the chucking plate 62 from being lifted upwardly due to the force from the pressure chamber 70.

Figure 8:
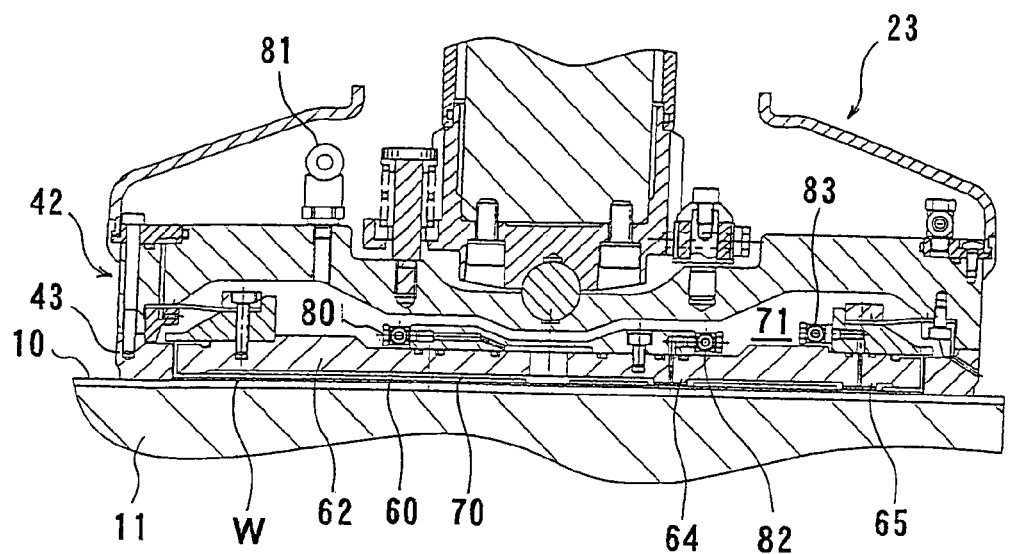
FIG. 8 is a vertical cross-sectional view showing the state of the top ring shown in FIG. 4 after a polishing process is finished.

When the polishing process is finished, as shown in FIG. 8, the supply of the pressurized fluid to the pressure chamber 70 is stopped, and the pressure in the pressure chamber 70 is released to the atmospheric pressure. Accordingly, the chucking plate 62 is moved downwardly and hence the lower ends of the attraction sections 64, 65 are brought into contact with the semiconductor wafer W. The pressure in the pressure chamber 71 is released to the atmospheric pressure or the pressure chamber 71 is evacuated to develop a negative pressure therein. If the pressure chamber 71 is maintained at a high pressure, then the semiconductor wafer W is strongly pressed against the polishing surface only in portions which are brought into contact with the attraction sections 64, 65. The semiconductor wafer W is attracted again to the lower surfaces of the attraction sections 64, 65. In this manner, since the chucking plate 62 is moved downwardly when the polishing process is finished, the semiconductor wafer W can reliably be attracted to the attraction sections 64, 65.

Figure 9:
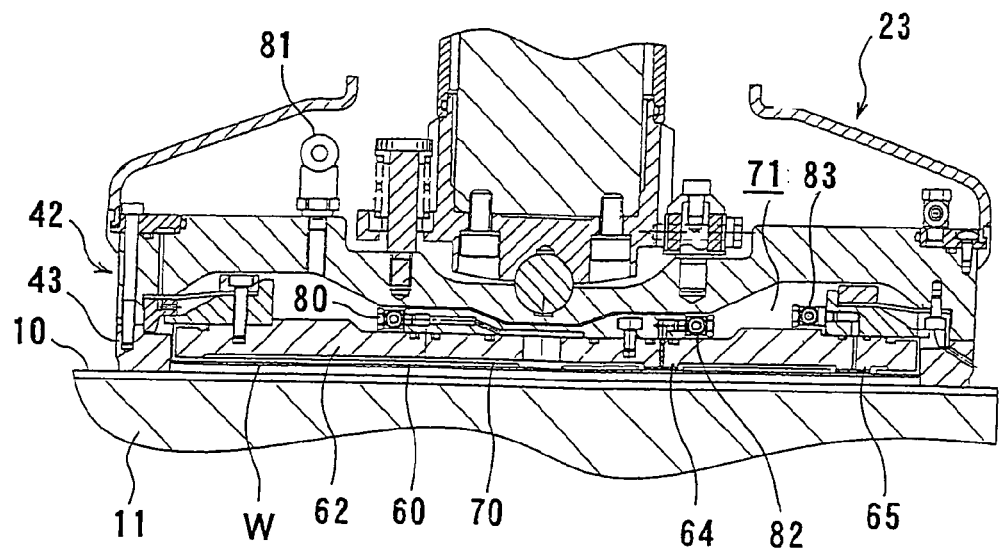
FIG. 9 is a vertical cross-sectional view showing the state of the top ring shown in FIG. 4 after a polishing process is finished.
Figure 10:
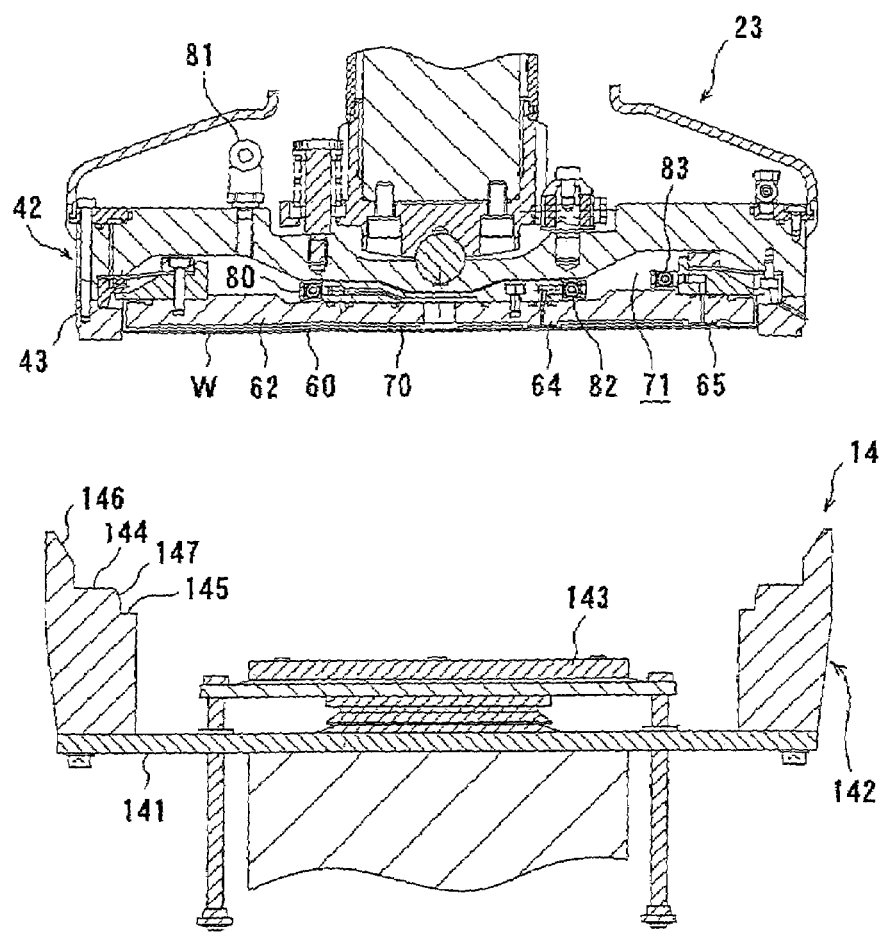
FIG. 10 is a vertical cross-sectional view showing the relationship between the top ring shown in FIG. 4 and the pusher.

The top ring 23 is moved to an overhanging position while the semiconductor wafer W is attracted to the top ring 23. As shown in FIG. 9, the pressure chamber 71 is connected to the pressure adjuster 120 through the fluid passage 81 to develop a negative pressure in the pressure chamber 71, thus positioning the chucking plate 62 upwardly with respect to the retainer ring 43. In this state, the top ring 23 is moved upwardly, and the top ring head 21 is moved angularly horizontally to move the top ring 23 to a position above the pusher 14 again as shown in FIG. 10.

Figure 11:
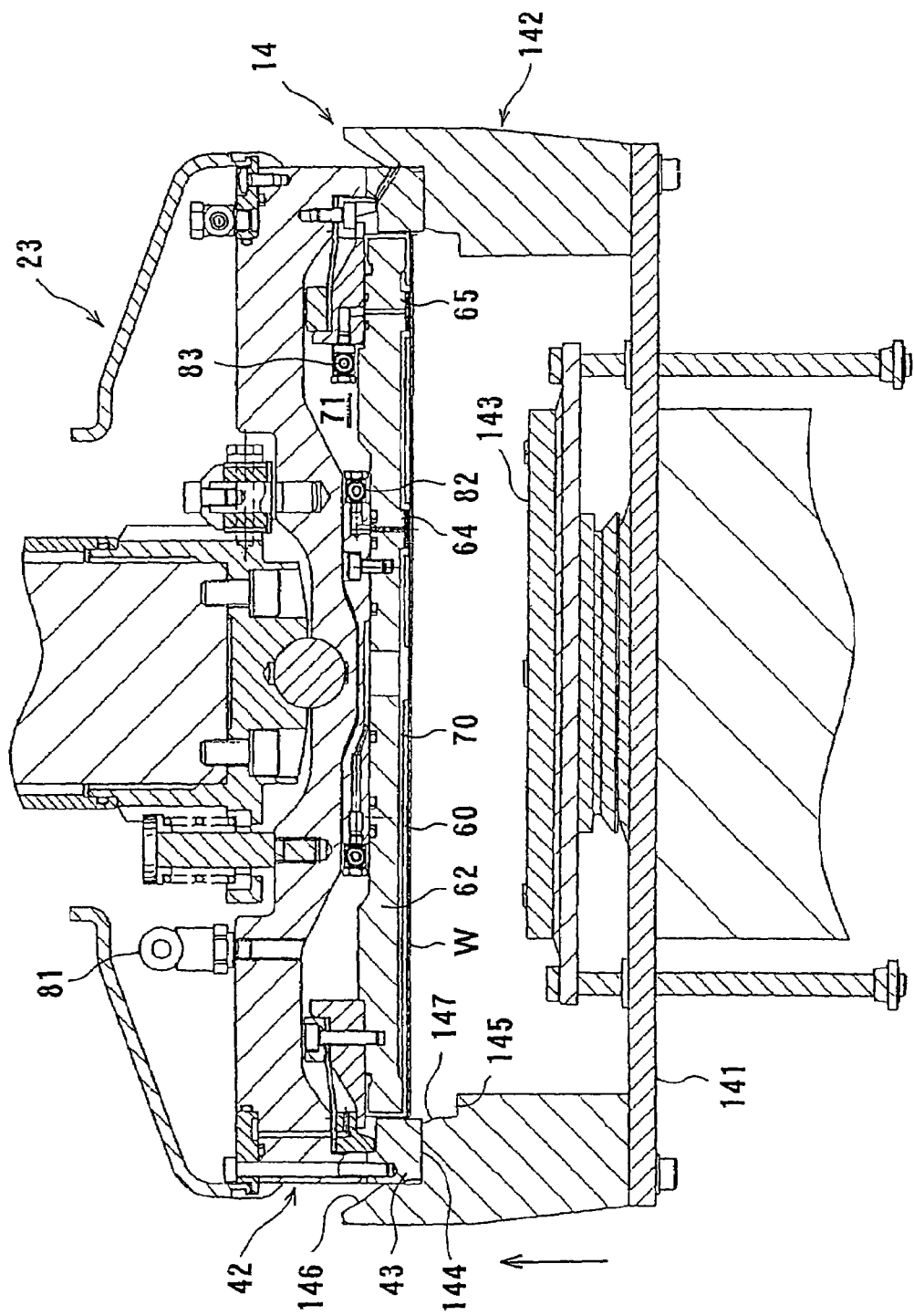
FIG. 11 is a vertical cross-sectional view showing the relationship between the top ring shown in FIG. 4 and the pusher.

Next, as shown in FIG. 11, the guide stage 141 of the pusher 14 is moved upwardly to guide the retainer ring 43 onto the upper step 144 of the wafer guide 142 by the taper 146 of the wafer guide 142. The upward movement of the guide stage 141 is finished when the upper step 144 of the wafer guide 142 is brought into contact with the lower surface of the retainer ring 43.

Figure 12:
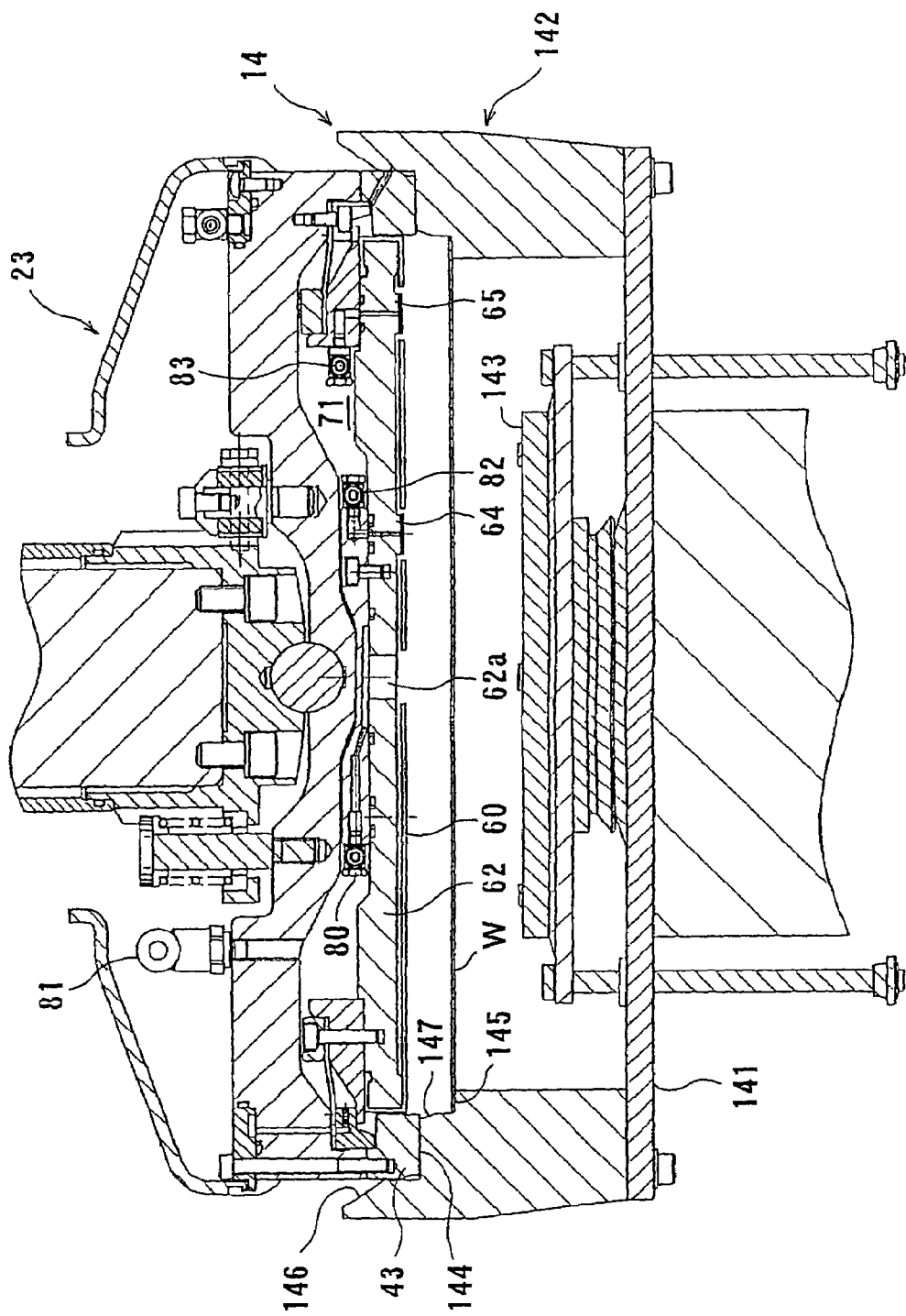
FIG. 12 is a vertical cross-sectional view showing the relationship between the top ring shown in FIG. 4 and the pusher.

In this state, as shown in FIG. 12, the opening 62a positioned at the center of the chucking plate 62 and the attraction sections 64, 65 are connected to the pressure adjuster 120 through the fluid passages 80, 82 and 83, respectively, and the pressurized fluid (e.g., a mixture of compressed air or nitrogen and pure water) is ejected downwardly from the opening 62a and the attraction sections 64, 65 at a pressure of 0.2 MPa, for example (water spout). The semiconductor wafer W is released from the lower surface of the elastic pad 60 by the ejection of the fluid. The semiconductor wafer W is centrally aligned by the taper 147 of the wafer guide 142 and is held by the lower step 145 of the wafer guide 142.

In the present embodiment, the pressurized fluid is ejected from the large-diameter opening 62a defined centrally in the chucking plate 62 and the attraction sections 64, 65. Therefore, the pressurized fluid is delivered into the region where the elastic pad 60 and the semiconductor wafer W are held in close contact with each other, and hence the semiconductor wafer W can be released reliably.

In this manner, the polished semiconductor wafer W is transferred from the top ring 23 to the pusher 14. The semiconductor wafer W and the top ring 23 are cleaned by pure water or a cleaning liquid as needed. Thereafter, the top ring 23 receives a new semiconductor wafer W from the pusher 14 and is moved to a position above the polishing table 10, and then a new polishing process is performed.

When the semiconductor wafer W is polished to a predetermined extent, the polishing process is finished. After the polishing process is performed, the characteristics of the polishing surface 10 are changed due to polishing, and the polishing capability thereof for a next polishing process is lowered. Therefore, the dressing unit 13 dresses the polishing surface 10. In a dressing process, the dresser 30 and the polishing table 11 are rotated about their own axes independently of each other, and the dressing member 34 is brought into close contact with the polishing surface 10 with a predetermined pressing force. At the same time that or before the dressing member 34 is brought into contact with the polishing surface 10, water is supplied from the water supply nozzle 16 to the upper surface of the polishing surface 10, for thereby washing out the used polishing liquid remaining on the polishing surface 10. When the dressing process is finished, the dresser 33 is returned to a standby position by the dressing head 31, and is cleaned by a dresser-cleaning device 18 (see FIG. 1) that is installed in the standby position.

The polished semiconductor wafer W which has been placed on the pusher 14 is transferred by the second transfer robot 4b to the cleaning device 7a or 7b having, for example, roll sponges for cleaning both surfaces of the semiconductor wafer W. After both surfaces of the semiconductor wafer W are cleaned by the cleaning device 7a or 7b, the semiconductor wafer W is transferred to the reversing device 5 or 6 by the second transfer robot 4b, and then the semiconductor wafer W is reversed by the reversing device 5 or 6. Thereafter, the first transfer robot 4a receives the semiconductor wafer W from the reversing device 5 or 6, and transfers the semiconductor wafer W to the second cleaning device 8a or 8b having a pen sponge for cleaning the upper surface and a spin dry function. The semiconductor wafer W is cleaned and dried by the second cleaning device 8a or 8b, and returned to the cassette 2a or 2b by the first transfer robot 4a.

Next, a second embodiment of a polishing method according to the present invention will be described in detail with reference to FIGS. 13 through 22. Those parts or elements of the second embodiment which have the same operation or function as those parts or elements of the first embodiment are denoted by identical reference numerals, and those which will not be described below are identical to those of the first embodiment. Other structural details other than the top ring are basically identical to those of the first embodiment.

Figure 13:
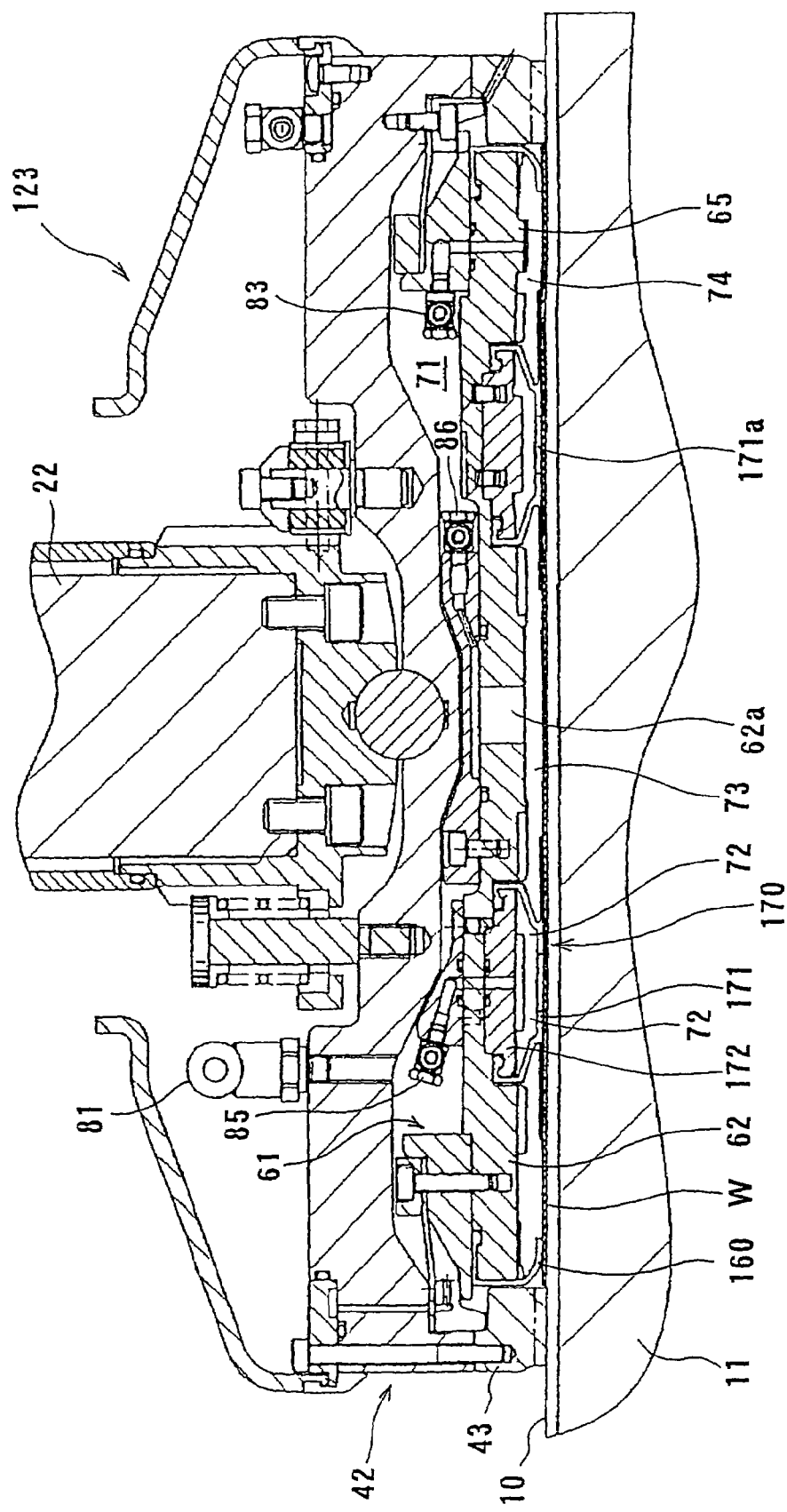
FIG. 13 is a vertical cross-sectional view showing a top ring according to a second embodiment of the present invention.

FIG. 13 is a vertical cross-sectional view showing a top ring according to the second embodiment of the present invention. In the present embodiment, a space defined in the top ring body 42 and the retainer ring 43 integrally fixed to the top ring body 42 houses therein an outer membrane 160 to be brought into contact with the outer circumferential portion of the semiconductor wafer W that is held by a top ring 123. The elastic pad according to the first embodiment is not provided in the present embodiment.

An outer circumferential portion of the outer membrane 160 is interposed between the holder ring 61 and the chucking plate 62 which is fixed to the lower end of the holder ring 61. The lower surface of the chucking plate 62 near the outer circumferential edge thereof is covered by the outer membrane 160. The outer membrane 160 has a lower surface which is brought into contact with the upper surface of the semiconductor wafer W to be polished. The outer membrane 160 is made of a rubber material having excellent strength and durability, such as ethylene propylene rubber (EPDM), polyurethane rubber, or silicone rubber. The semiconductor wafer W has a recess, which is called a notch or an orientation flat, formed in the outer circumferential edge thereof for recognizing (specifying) the orientation of the semiconductor wafer W. It is preferable that the outer membrane 160 extends inwardly of the chucking plate 62 beyond such a notch or an orientation flat.

A ring tube 170 serving as a contact member which is brought into close contact with the semiconductor wafer W is disposed in a space defined between the chucking plate 62 and the semiconductor wafer W. In the present embodiment, as shown in FIG. 13, the ring tube 170 is disposed so as to surround the opening 62a positioned at the center of the chucking plate 62. In the present embodiment, only the outer attraction section 65 is provided outwardly of the ring tube 170, and no inner attraction section is provided.

The ring tube 170 comprises an elastic membrane 171 which is brought into close contact with the upper surface of the semiconductor wafer W, and a ring tube holder 172 for detachably holding the elastic membrane 171. The ring tube 170 has a pressure chamber 72 defined by the elastic membrane 171 and the ring tube holder 172. The space between the chucking plate 62 and the semiconductor wafer W is divided into a plurality of spaces by the ring tube 170. Specifically, a pressure chamber 73 is defined inwardly of the ring tube 170, i.e., around the opening 62a positioned at the center of the chucking plate 62, and a pressure chamber 74 is defined outwardly of the ring tube 170, i.e., around the attraction section 65. The elastic membrane 171 of the ring tube 170 is made of a rubber material having high strength and durability, such as ethylene propylene rubber (EPDM), polyurethane rubber, or silicone rubber.

Figure 14A:
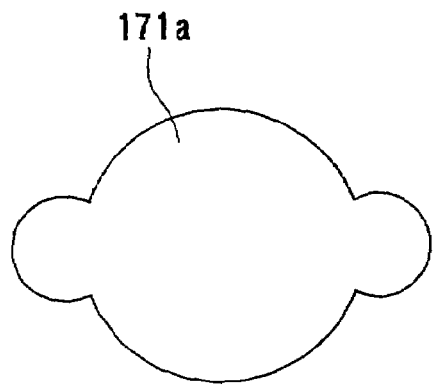
FIGS. 14A through 14G are views each showing a shape of hole formed in an elastic membrane of a ring tube of the top ring shown in FIG. 13.
Figure 14C:
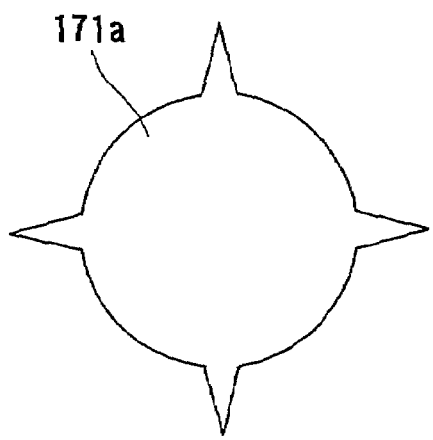
Figure 14B:
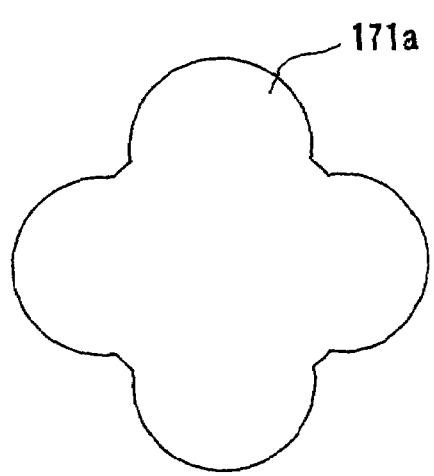
Figure 14D:
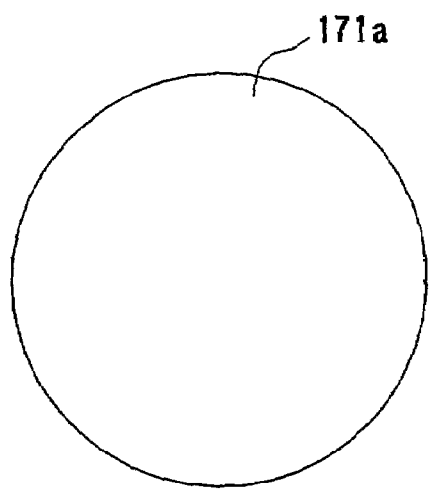
Figure 14E:
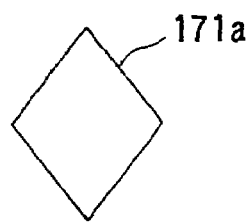
Figure 14F:
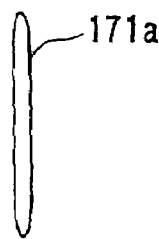
Figure 14G:
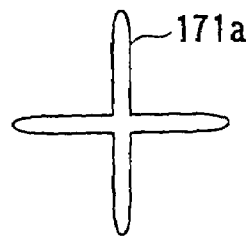

The elastic membrane 171 of the ring tube 170 has a hole 171a formed in a surface thereof to be brought into close contact with the semiconductor wafer W. As shown in FIGS. 14A and 14B, the hole 171a may have a shape of a combination of a plurality of ellipses or circles. Alternatively, as shown in FIG. 14C, the hole 171a may have a shape of an ellipse with triangular recesses. Alternatively, as shown in FIG. 14D, the hole 171a may have a large elliptical shape. Alternatively, as shown in FIG. 14E, the hole 171a may have a square or rhombic shape, or as shown in FIGS. 14F and 14G, the hole 171a may be a simple slit.

A pressure chamber 72 in the ring tube 71 communicates with a fluid passage 85 comprising a tube, a connector, and the like. The pressure chamber 72 is connected to the pressure adjuster 120 (see FIG. 3) through a regulator provided on the fluid passage 85. The pressure chamber 73 communicates with a fluid passage 86 comprising a tube, a connector, and the like. The pressure chamber 73 is connected to the pressure adjuster 120 through a regulator provided on the fluid passage 86.

The pressure chamber 71 above the chucking plate 62 and the pressure chambers 72, 73 and 74 are supplied with a pressurized fluid such as pressurized air, or the atmospheric pressure or vacuum is produced in the pressure chambers 71, 72, 73 and 74 through the fluid passages 81, 85, 86 and 83. Specifically, the regulators provided on the fluid passages 81, 85, 86 and 83 of the pressure chambers 71~74 can regulate the pressures of the pressurized fluids supplied to the pressure chambers 71~74, respectively. Thus, the pressures in the pressure chambers 71~74 can be controlled independently or the atmospheric pressure or vacuum is produced in the pressure chambers 71~74. In this manner, the pressures in the pressure chambers 71~74 are varied independently by the regulators, and hence the pressing force for pressing the semiconductor wafer W against the polishing pad 10 can be adjusted with respect to local areas of the semiconductor wafer W.

In this case, the pressurized fluid supplied to the pressure chambers 72~74 and the atmospheric pressure may independently be controlled in temperature, for thereby directly controlling a temperature of a workpiece such as a semiconductor wafer from a backside of a surface thereof to be polished. Particularly, when each of the pressure chambers is independently controlled in temperature, the rate of chemical reaction can be controlled in the chemical polishing process of CMP.

Operation of the polishing apparatus according to the present embodiment will be described below. First, the first transfer robot 4a takes a semiconductor wafer W from the cassette 2a or 2b, and the reversing device 5 or 6 reverses the semiconductor wafer W. Thereafter, the second transfer robot 4b transfers and places the semiconductor wafer W onto the pusher 14. In this state, the top ring head 21 of the top ring unit 12 is angularly moved to bring the top ring 123 to a position above the pusher 14.

FIG. 15 is a vertical cross-sectional view showing the state of the polishing apparatus at this time. In the state shown in FIG. 15, the pressure chamber 71 in the top ring 123 is connected to the pressure adjuster 120 through the fluid passage 81, so that a negative pressure is developed in the pressure chamber 71. As sown in FIG. 15, the chucking plate 62 is thus positioned upwardly with respect to the retainer ring 43, and hence the semiconductor wafer W can be attracted reliably, as with the first embodiment.

Figure 16:
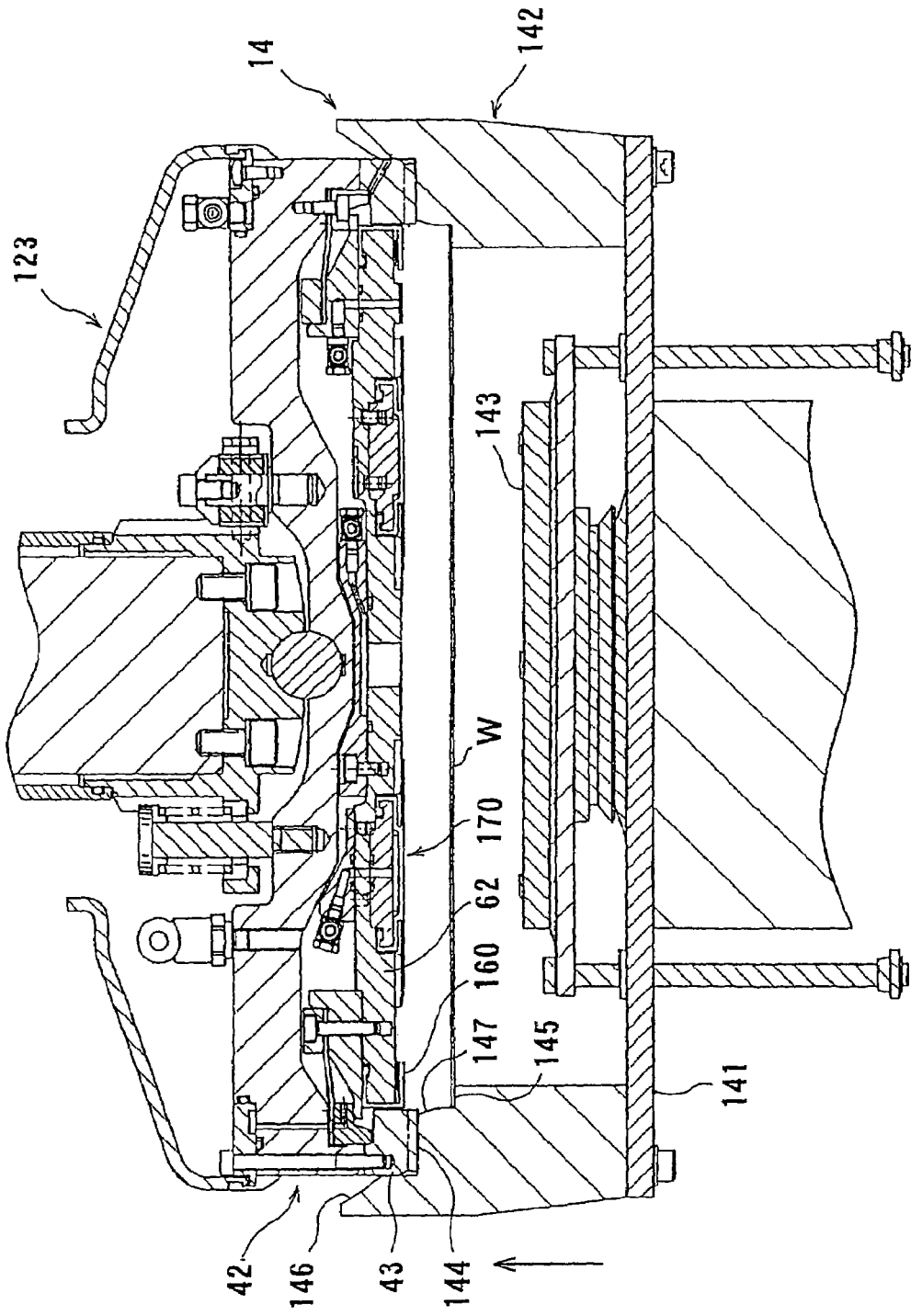
FIG. 16 is a vertical cross-sectional view showing the relationship between the top ring shown in FIG. 13 and the pusher.

Next, as shown in FIG. 16, the guide stage 141 of the pusher 14 is moved upwardly to guide the retainer ring 43 onto the upper step 144 of the wafer guide 142 by the taper 146 of the wafer guide 142. The upward movement of the guide stage 141 is finished when the upper step 144 of the wafer guide 142 is brought into contact with the lower surface of the retainer ring 43.

Figure 17:
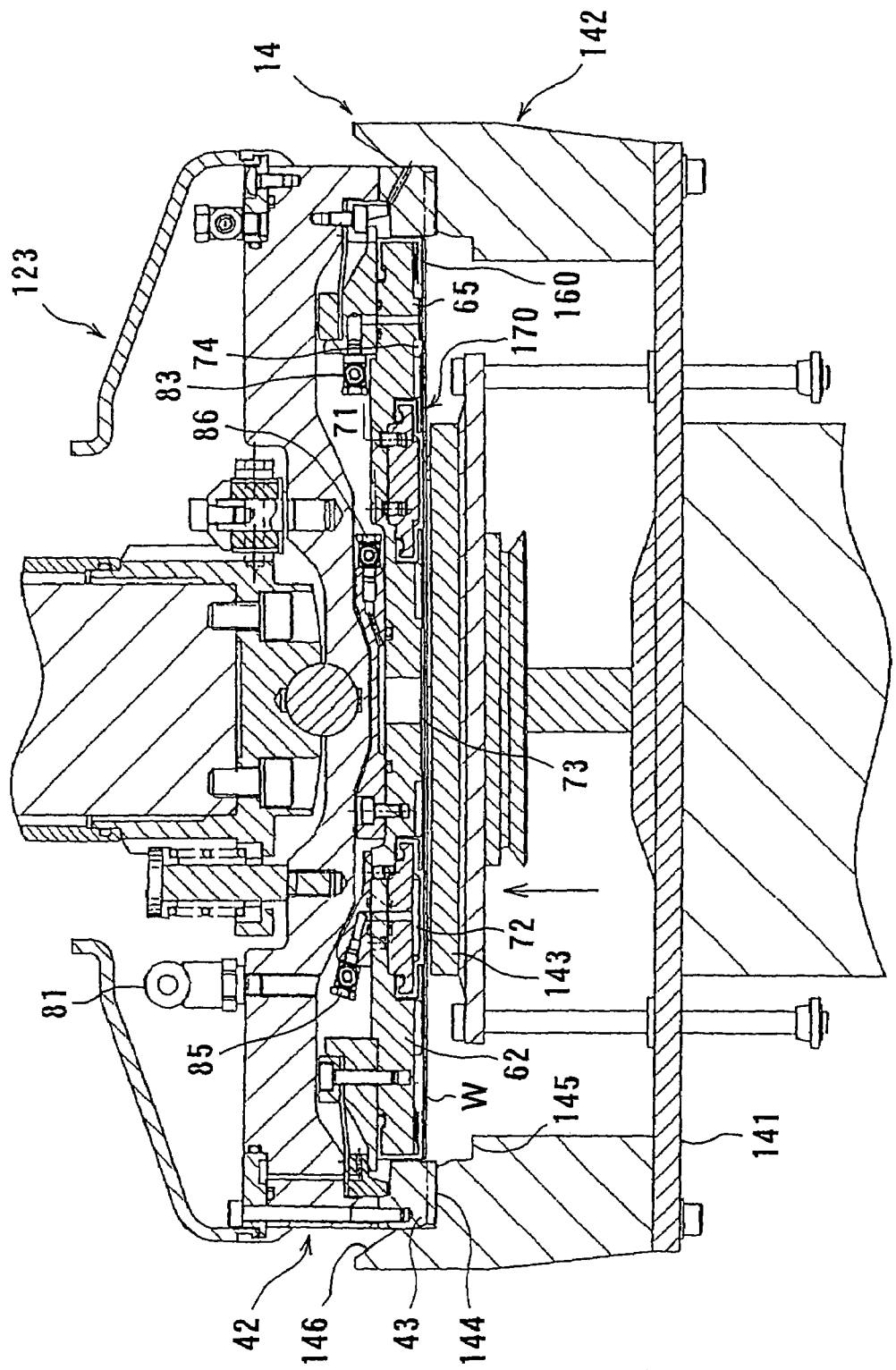
FIG. 17 is a vertical cross-sectional view showing the relationship between the top ring shown in FIG. 13 and the pusher.

In this state, as shown in FIG. 17, the push stage 143 of the pusher 14 is moved upwardly to hold the pattern surface of the semiconductor wafer W which has been placed on the lower step 145 of the wafer guide 142 and bring the semiconductor wafer W into close contact with the outer membrane 160 and the ring tube 170 of the top ring 123. The fluid passages 85, 86 and 83 communicating respectively with the pressure chamber 72 in the ring tube 170 and the pressure chambers 73, 74 are connected to the pressure adjuster 120, so that negative pressures are developed in the fluid passages 85, 86 and 83 to attract the semiconductor wafer W. For example, a pressure of −80 kPa is developed in the fluid passage 83 and a pressure of −20 kPa is developed in the fluid passages 85, 86 so as to attract the semiconductor wafer W.

At this time, as described above, since the negative pressure is developed in the pressure chamber 71 in the top ring 123 so as to position the chucking plate 62 upwardly with respect to the retainer ring 43 in advance, the semiconductor wafer W is transferred while the outer circumferential portion thereof is guided by the retainer ring 43. Therefore, the semiconductor wafer W is not caught by the retainer ring 43 when the chucking plate 62 is moved upwardly, and hence the semiconductor wafer W can be prevented from being dropped off and damaged.

When the attraction of the semiconductor wafer W is completed, the pusher 14 is moved downwardly, and the top ring head 21 is moved angularly horizontally to a position above the polishing surface 10 while attracting the semiconductor wafer W. The outer circumferential edge of the semiconductor wafer W is held by the retainer ring 43 so that the semiconductor wafer W is not dislodged from the top ring 123. The top ring 123 is moved downwardly while being rotated to press the semiconductor wafer W against the polishing surface 10 on the rotating polishing table 11. Specifically, during the polishing process, the semiconductor wafer W is released from the attraction, and is held by the lower surface of the top ring 123. The top ring air cylinder 111 coupled to the top ring shaft 22 is operated to press the retainer ring 43 fixed to the lower end of the top ring 123 against the polishing surface 10 of the polishing table 11 under a predetermined pressing force. In this state, a pressurized fluid having a predetermined pressure is supplied to the pressure chambers 72, 73 and 74, thereby pressing the semiconductor wafer W against the polishing surface of the polishing table 11. At this time, a polishing liquid is supplied from polishing liquid supply nozzle 15, and the semiconductor wafer W is polished in the presence of the polishing liquid between the surface to be polished (i.e. lower surface) of the semiconductor wafer W and the polishing surface 10. FIG. 13 shows the state in which the semiconductor wafer W is polished.

As described above, the pressing force applied by the top ring air cylinder 111 to press the retainer ring 43 against the polishing surface 10 and the pressing forces applied by the pressurized air supplied to the pressure chambers 72~74 to press the semiconductor wafer W against the polishing surface 10 are appropriately adjusted to polish the semiconductor wafer W. When the pressurized fluid is supplied to the pressure chambers 72~74, the chucking plate 62 is subjected to an upward force. In the present embodiment, the pressurized fluid is supplied to the pressure chamber 71 through the fluid passage 81, thus preventing the chucking plate 62 from being lifted upwardly due to the force from the pressure chamber 72.

Figure 18:
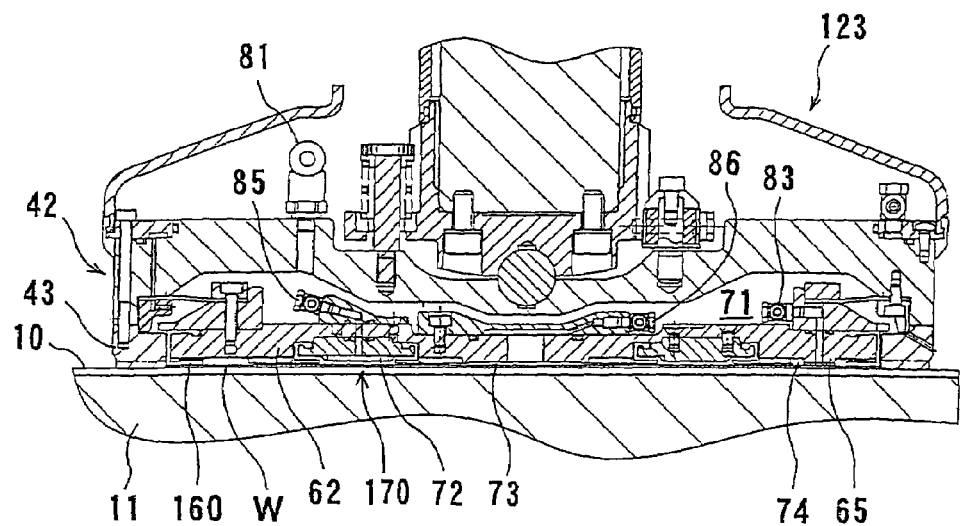
FIG. 18 is a vertical cross-sectional view showing the state of the top ring shown in FIG. 13 after a polishing process is finished.

When the polishing process is finished, as shown in FIG. 18, the supply of the pressurized fluid to the pressure chambers 72~74 is stopped, and the pressures in the pressure chambers 72~74 are released to the atmospheric pressure. Accordingly, the chucking plate 62 is moved downwardly and hence the lower end of the attraction section 65 is brought into contact with the semiconductor wafer W. The pressure in the pressure chamber 71 is released to the atmospheric pressure, or the pressure chamber 71 is evacuated to develop a negative pressure therein. If the pressure chamber 71 is maintained at a high pressure, then the semiconductor wafer W is strongly pressed against the polishing surface only in a portion which is brought into contact with the attraction section 65. The semiconductor wafer W is attracted again to the lower surface of the attraction section 65 due to vacuum. When the polishing process is finished, the semiconductor wafer W and the chucking plate 62 may have occasionally been spaced from each other. In such a case, the attraction section 65 fails to attract the semiconductor wafer W even if the attraction section 65 attempts to attract the semiconductor wafer W. In the present embodiment, as described above, since the chucking plate 62 is moved downwardly when the polishing process is finished, the semiconductor wafer W can reliably be attracted to the attraction section 65.

Figure 19:
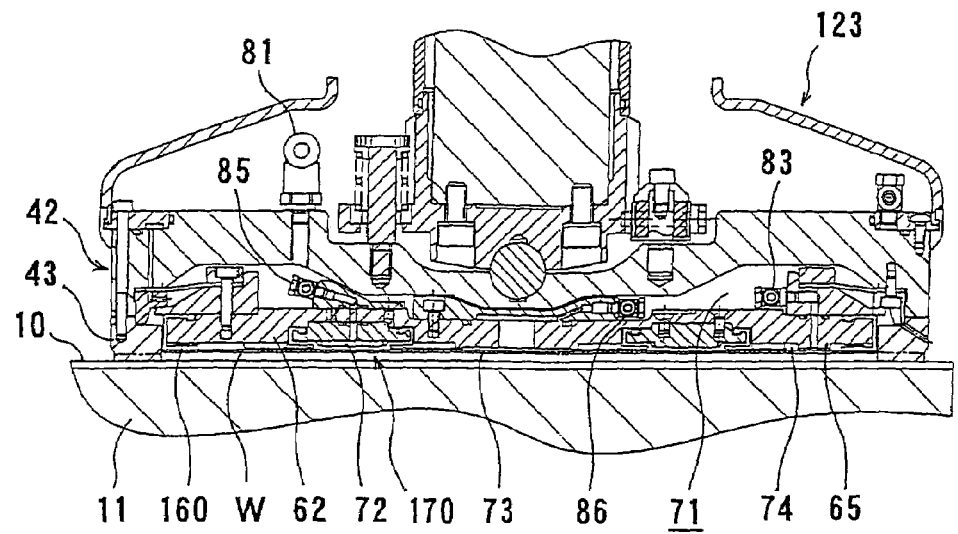
FIG. 19 is a vertical cross-sectional view showing the state of the top ring shown in FIG. 13 after a polishing process is finished.

The top ring 123 is moved to an overhanging position while the semiconductor wafer W is attracted to the top ring 123. As shown in FIG. 19, the pressure chamber 71 is connected to the pressure adjuster 120 through the fluid passage 81 to develop a negative pressure in the pressure chamber 71 in the top ring 123, thus positioning the chucking plate 62 upwardly with respect to the retainer ring 43. In this state, the top ring 123 is moved upwardly, and the top ring head 21 is moved angularly horizontally to bring the top ring 123 to a position above the pusher 14 again as shown in FIG. 20. At this time, it is preferable to supply the pressurized fluid to the pressure chamber 72 in the ring tube 170 to pressurize the pressure chamber 72. In this manner, the semiconductor wafer W can easily be released from the outer membrane 160 and the ring tube 170.

Figure 21:
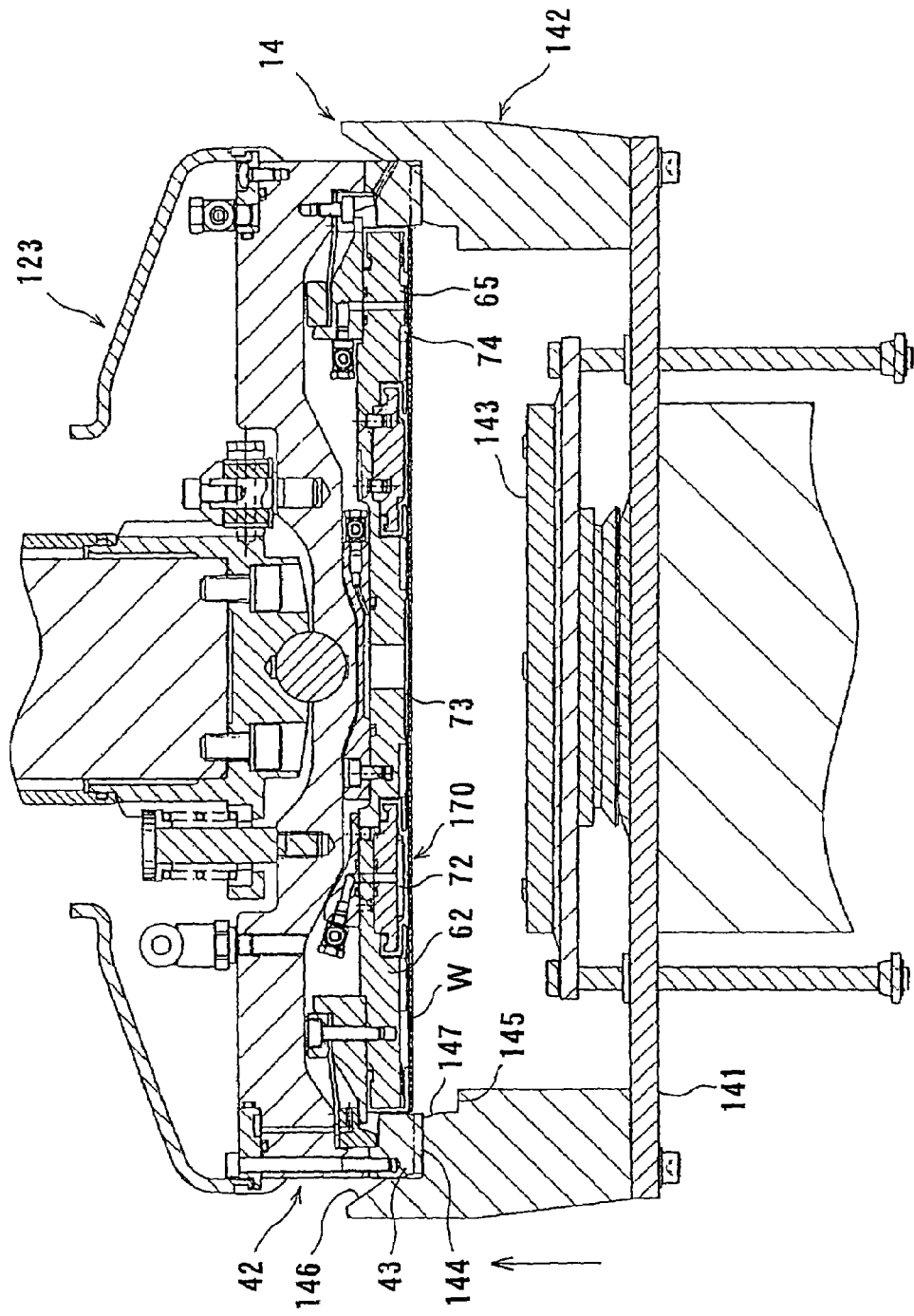
FIG. 21 is a vertical cross-sectional view showing the relationship between the top ring shown in FIG. 13 and the pusher.

Then, as shown in FIG. 21, the guide stage 141 of the pusher 14 is moved upwardly to guide the retainer ring 43 onto the upper step 144 of the wafer guide 142 by the taper 146 of the wafer guide 142. The upward movement of the guide stage 141 is finished when the upper step 144 of the wafer guide 142 is brought into contact with the lower surface of the retainer ring 43.

Figure 22:
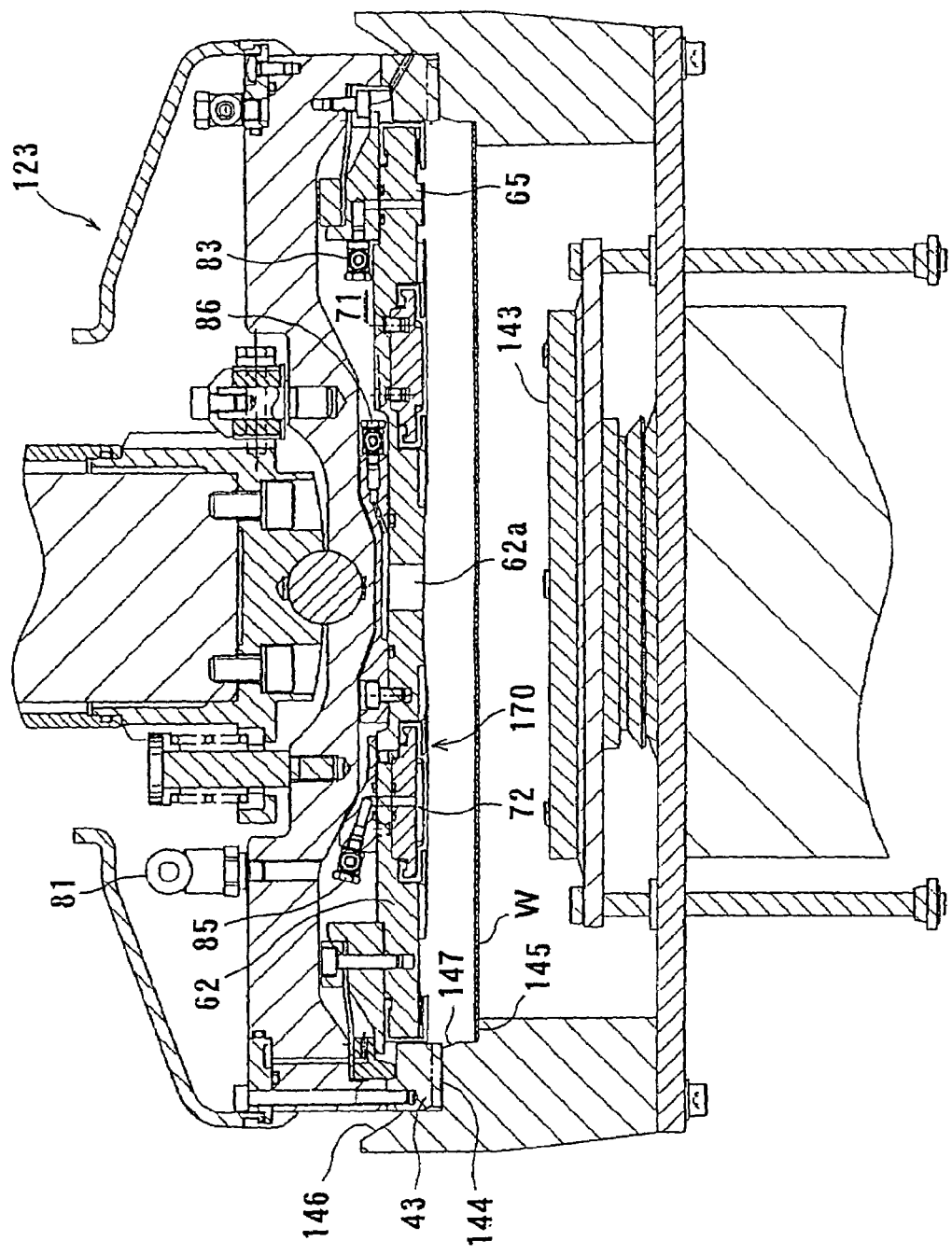
FIG. 22 is a vertical cross-sectional view showing the relationship between the top ring shown in FIG. 13 and the pusher.

In this state, as shown in FIG. 22, the opening 62a positioned at the center of the chucking plate 62 and the attraction section 65 are connected to the pressure adjuster 120 through the fluid passages 86, 83, respectively, and a pressurized fluid (e.g., a mixture of compressed air or nitrogen and pure water (D. I. water, de-ionized water)) is ejected downwardly from the opening 62a and the attraction section 65 (water spout). The pressure chamber 72 in the ring tube 170 is connected to the pressure adjuster 120, and a pressurized fluid (e.g., a mixture of compressed air or nitrogen and pure water) is ejected downwardly from the hole 171a (see FIG. 13) defined in the elastic membrane 171 of the ring tube 170 (water spout). The semiconductor wafer W is released from the top ring 123 by the ejection of the fluid. The semiconductor wafer W is centrally aligned by the taper 147 of the wafer guide 142 and is held by the lower step 145 of the wafer guide 142. For example, the fluid is ejected from the opening 62a at a pressure of 0.03 MPa, from the attraction section 65 at a pressure of 0.2 MPa, and from the hole 171a of the ring tube 170 at a pressure of 0.05 MPa. In order to easily break the close contact between the elastic membrane 171 of the ring tube 170 and the semiconductor wafer W, it is preferable to eject the fluid first from the hole 171a of the ring tube 170 and then from the opening 62a and the attraction section 65.

In this manner, in the present embodiment, the pressurized fluid is ejected from the large-diameter opening 62a defined centrally in the chucking plate 62, the attraction section 65, and the hole 171a defined in the elastic membrane 171 of the ring tube 170. Therefore, the pressurized fluid is delivered into the region where the outer membrane 160 and the elastic membrane 171 of the ring tube 170 are held in close contact with the semiconductor wafer W, and hence the semiconductor wafer W can be released more reliably. In the case where the hole 171a defined in the elastic membrane 171 of the ring tube 170 has a shape shown in FIG. 14C or 14D, the semiconductor wafer W can be released more smoothly without producing noise at the time of releasing the semiconductor wafer W.

In the above embodiment, although the fluid passages 80–86 are provided separately from each other, these fluid passages may be combined together, or the pressure chambers may communicate with each other, for example. In this manner, the embodiment may be freely modified depending on the magnitude of the pressing force to be applied to the semiconductor wafer W and the position where the pressing force is applied to the semiconductor wafer W. In the above embodiment, although the ring tube 170 is brought into direct contact with the semiconductor wafer W, the present invention is not limited to such an arrangement. For example, an elastic pad may be interposed between the ring tube 170 and the semiconductor wafer W to bring the ring tube 170 into indirect contact with the semiconductor wafer W.

In the above embodiments, although the polishing pad serves as the polishing surface, the present invention is not limited to the above structure. For example, the polishing surface may be constituted by a fixed abrasive. The fixed abrasive is formed into a flat plate comprising abrasive particles fixed by a binder. With the fixed abrasive for polishing, the polishing process is performed by abrasive particles that are self-generated from the fixed abrasive. The fixed abrasive comprises abrasive particles, a binder, and pores. For example, cerium dioxide ($CeO_2$) having an average particle diameter of 0.5 μm or less is used as an abrasive particle, and epoxy resin is used as a binder. Such a fixed abrasive forms a harder polishing surface. The fixed abrasive includes a fixed abrasive pad having a two-layer structure formed by a thin layer of a fixed abrasive and an elastic polishing pad attached to a lower surface of the thin layer of the fixed abrasive. IC-1000 described above may be used for another hard polishing surface.

Although certain preferred embodiments of the present invention have been shown and described in detail, it should be understood that various changes and modifications may be made therein without departing from the scope of the appended claims.

As described above, according to the present invention, when the pressurized fluid is ejected from the opening defined centrally in the vertically movable member, the pressurized fluid is delivered into the region where the elastic membrane and the workpiece to be polished are held in close contact with each other. Therefore, the workpiece can reliably be released. Further, the hole is formed in the surface, to be brought into contact with the workpiece, of the elastic membrane, so that the pressurized fluid is ejected not only from the opening defined centrally in the vertically movable member, but also from the above hole, thereby releasing the workpiece more reliably.

Furthermore, according to the present invention, because the workpiece is attracted after the vertically movable member is moved downwardly to bring the workpiece into close contact with the attraction section when the polishing process is finished, it is possible to attract the workpiece reliably.

INDUSTRIAL APPLICABILITY

The present invention is preferably applicable to a polishing method for polishing a workpiece, such as a semiconductor wafer having a thin film formed on a surface thereof, to a flat mirror finish.

What is claimed is:

1. A polishing method for polishing a workpiece by pressing the workpiece against a polishing surface with use of a top ring for holding the workpiece, said polishing method comprising:
    defining a pressure chamber in the top ring by attaching an elastic membrane to a lower surface of a vertically movable member;
    polishing the workpiece while a pressurized fluid is supplied to the pressure chamber so that the workpiece is pressed against the polishing surface by a fluid pressure of the fluid; and
    releasing the workpiece which has been polished from the top ring by ejecting the pressurized fluid from an opening defined centrally in the vertically movable member.

2. A polishing method according to claim 1, wherein:
a hole is provided in a surface, to be brought into close contact with the workpiece, of the elastic membrane which defines the pressure chamber; and
said releasing comprises releasing the workpiece which has been polished from the top ring by ejecting the pressurized fluid not only from the opening defined centrally in the vertically movable member, but also from the hole provided in the elastic membrane.

3. A polishing method according to claim 2, wherein the pressurized fluid is ejected from the opening defined centrally in the vertically movable member after the pressurized fluid is ejected from the hole of the elastic membrane.

4. A polishing method for polishing a workpiece by pressing the workpiece against a polishing surface with use of a top ring for holding the workpiece, said polishing method comprising:
defining a pressure chamber in the top ring by attaching an elastic membrane to a lower surface of a vertically movable member;
polishing the workpiece while a pressurized fluid is supplied to the pressure chamber so that the workpiece is pressed against the polishing surface by a fluid pressure of the fluid;
when said polishing is finished, moving the vertically movable member downwardly so as to bring the workpiece into close contact with an attraction section provided on the vertically movable member; and
attracting the workpiece to the top ring by the attraction section.

5. A polishing method for polishing a workpiece by pressing the workpiece against a polishing surface with use of a top ring for holding the workpiece, said polishing method comprising:
defining a pressure chamber in the top ring by attaching an elastic membrane to a lower surface of a vertically movable member;
guiding the workpiece to the top ring while the vertically movable member is positioned upwardly with respect to a retainer ring which holds an outer circumferential edge of the workpiece;
attracting the workpiece which has been guided to the top ring to the top ring by an attraction section provided on the vertically movable member;
moving the workpiece which is held by the top ring onto the polishing surface; and
polishing the workpiece while a pressurized fluid is supplied to the pressure chamber so that the workpiece is pressed against the polishing surface by a fluid pressure of the fluid.

* * * * *